United States Patent
Scudder et al.

(10) Patent No.: US 8,999,861 B1
(45) Date of Patent: *Apr. 7, 2015

(54) SEMICONDUCTOR STRUCTURE WITH SUBSTITUTIONAL BORON AND METHOD FOR FABRICATION THEREOF

(75) Inventors: Lance Scudder, Sunnyvale, CA (US); Pushkar Ranade, Los Gatos, CA (US); Charles Stager, Austin, TX (US); Lucian Shifren, San Jose, CA (US); Dalong Zhao, San Jose, CA (US); U.C. Sridharan, San Jose, CA (US); Michael Duane, San Carlos, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/469,249

(22) Filed: May 11, 2012

Related U.S. Application Data

(60) Provisional application No. 61/518,771, filed on May 11, 2011.

(51) Int. Cl.
*H01L 29/78* (2006.01)
*H01L 21/02* (2006.01)

(52) U.S. Cl.
CPC .......... *H01L 21/02205* (2013.01) 438/202; 438/527; 257/369; 257/E21.268; 257/E29.255

(58) Field of Classification Search
USPC ............ 438/197, 283, 479, 202, 221, 527; 257/369, 377, 408
See application file for complete search history.

(56) References Cited

U.S. PATENT DOCUMENTS

| | | | |
|---|---|---|---|
| 3,958,266 | A | 5/1976 | Athanas |
| 4,000,504 | A | 12/1976 | Berger |
| 4,021,835 | A | 5/1977 | Etoh et al. |
| 4,242,691 | A | 12/1980 | Kotani et al. |
| 4,276,095 | A | 6/1981 | Beilstein, Jr. et al. |
| 4,315,781 | A | 2/1982 | Henderson |
| 4,518,926 | A | 5/1985 | Swanson |
| 4,559,091 | A | 12/1985 | Allen et al. |
| 4,578,128 | A | 3/1986 | Mundt et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Banerjee, et al. "Compensating Non-Optical Effects using Electrically-Driven Optical Proximity Correction", Proc. of SPIE vol. 7275 72750E, 2009.

(Continued)

*Primary Examiner* — Thao X Le
*Assistant Examiner* — Matthew Gordon
(74) *Attorney, Agent, or Firm* — Charles S. Fish

(57) ABSTRACT

A method for fabricating a semiconductor structure so as to have reduced junction leakage is disclosed. The method includes providing substitutional boron in a semiconductor substrate. The method includes preparing the substrate using a pre-amorphization implant and a carbon implant followed by a recrystallization step and a separate defect repair/activation step. Boron is introduced to the pre-amorphized region preferably by ion implantation.

6 Claims, 37 Drawing Sheets

(56) References Cited

U.S. PATENT DOCUMENTS

| | | | |
|---|---|---|---|
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |
| 5,373,186 A | 12/1994 | Schubert et al. | |
| 5,384,476 A | 1/1995 | Nishizawa et al. | |
| 5,426,328 A | 6/1995 | Yilmaz et al. | |
| 5,444,008 A | 8/1995 | Han et al. | |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,856,003 A | 1/1999 | Chiu | |
| 5,861,334 A | 1/1999 | Rho | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasumura et al. | |
| 5,899,714 A * | 5/1999 | Farrenkopf et al. | 438/202 |
| 5,918,129 A | 6/1999 | Fulford, Jr. et al. | |
| 5,923,067 A | 7/1999 | Voldman | |
| 5,923,987 A | 7/1999 | Burr | |
| 5,936,868 A | 8/1999 | Hall | |
| 5,946,214 A | 8/1999 | Heavlin et al. | |
| 5,985,705 A | 11/1999 | Seliskar | |
| 5,989,963 A | 11/1999 | Luning et al. | |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,103,562 A | 8/2000 | Son et al. | |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,019 B1 | 4/2002 | Yu et al. | |
| 6,391,752 B1 | 5/2002 | Colinge et al. | |
| 6,426,260 B1 | 7/2002 | Hshieh | |
| 6,426,279 B1 | 7/2002 | Huster et al. | |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 | 1/2003 | Ishida et al. | |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara et al. | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |
| 6,822,297 B2 | 11/2004 | Nandakumar et al. | |

(56) References Cited

U.S. PATENT DOCUMENTS

| | | | |
|---|---|---|---|
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,972,223 B2 | 12/2005 | Weimer et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,339,215 B2 | 3/2008 | Chidambaram |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,524,740 B1 * | 4/2009 | Liu et al. ............... 438/479 |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,553,717 B2 | 6/2009 | Chakravarthi et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,631 B2 | 3/2010 | Murthy et al. |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |

(56) References Cited

U.S. PATENT DOCUMENTS

| | | |
|---|---|---|
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,617 B2 * | 9/2012 | Thompson et al. ............ 438/197 |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0001907 A1 * | 1/2002 | Weon et al. .................... 438/289 |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0024876 A1 | 2/2006 | Chidambaram et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 * | 10/2006 | Venugopal et al. ............ 438/197 |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0194069 A1 * | 8/2008 | Surdeanu et al. ............. 438/283 |
| 2008/0197439 A1 | 8/2008 | Goerlach et al. |
| 2008/0199999 A1 | 8/2008 | Weijtmans et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0079008 A1 * | 3/2009 | Nandakumar et al. ........ 257/377 |
| 2009/0081858 A1 * | 3/2009 | Qin et al. ...................... 438/527 |
| 2009/0108350 A1 | 4/2009 | Cai et al. |
| 2009/0134468 A1 | 5/2009 | Tsuchiya et al. |
| 2009/0179280 A1 * | 7/2009 | Kohli et al. .................... 257/408 |
| 2009/0224319 A1 | 9/2009 | Kohli |
| 2009/0278209 A1 * | 11/2009 | Noda ............................. 257/408 |
| 2009/0286367 A1 * | 11/2009 | Krull et al. ..................... 438/221 |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |

(56) References Cited

U.S. PATENT DOCUMENTS

| | | | |
|---|---|---|---|
| 2010/0038724 | A1 | 2/2010 | Anderson et al. |
| 2010/0078729 | A1* | 4/2010 | Fukutome et al. ............ 257/369 |
| 2010/0100856 | A1 | 4/2010 | Mittal |
| 2010/0133624 | A1* | 6/2010 | Nandakumar et al. ........ 257/369 |
| 2010/0148153 | A1 | 6/2010 | Hudait et al. |
| 2010/0149854 | A1 | 6/2010 | Vora |
| 2010/0187641 | A1 | 7/2010 | Zhu et al. |
| 2010/0207182 | A1 | 8/2010 | Paschal |
| 2010/0270600 | A1 | 10/2010 | Inukai et al. |
| 2010/0276761 | A1 | 11/2010 | Tung et al. |
| 2011/0059588 | A1 | 3/2011 | Kang |
| 2011/0073961 | A1 | 3/2011 | Dennard et al. |
| 2011/0074498 | A1 | 3/2011 | Thompson et al. |
| 2011/0079860 | A1 | 4/2011 | Verhulst |
| 2011/0079861 | A1 | 4/2011 | Shifren et al. |
| 2011/0095811 | A1 | 4/2011 | Chi et al. |
| 2011/0147828 | A1 | 6/2011 | Murthy et al. |
| 2011/0169082 | A1 | 7/2011 | Zhu et al. |
| 2011/0175140 | A1 | 7/2011 | Taylor et al. |
| 2011/0175170 | A1 | 7/2011 | Wang et al. |
| 2011/0180880 | A1 | 7/2011 | Chudzik et al. |
| 2011/0193164 | A1 | 8/2011 | Zhu |
| 2011/0212590 | A1 | 9/2011 | Wu et al. |
| 2011/0230039 | A1 | 9/2011 | Mowry et al. |
| 2011/0242921 | A1 | 10/2011 | Tran et al. |
| 2011/0248352 | A1 | 10/2011 | Shifren et al. |
| 2011/0294278 | A1 | 12/2011 | Eguchi et al. |
| 2011/0309447 | A1 | 12/2011 | Arghavani et al. |
| 2012/0021594 | A1 | 1/2012 | Gurtej et al. |
| 2012/0034745 | A1 | 2/2012 | Colombeau et al. |
| 2012/0056275 | A1 | 3/2012 | Cai et al. |
| 2012/0065920 | A1 | 3/2012 | Nagumo et al. |
| 2012/0080777 | A1* | 4/2012 | Hamaguchi et al. .......... 257/632 |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0161210 | A1 | 6/2012 | Heinrich et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO 2005/093831 | 10/2005 |
| WO | WO2011/062788 | 5/2011 |

OTHER PUBLICATIONS

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, Tet al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contrbution of Vacancies to Carbon Out-Diffusion in Silicon", Appl. Phys. Lett., vol. 74, No. 3, pp. 392-394, Jan. 1999.

(56) References Cited

OTHER PUBLICATIONS

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

\* cited by examiner

US 8,999,861 B1

SEMICONDUCTOR STRUCTURE WITH SUBSTITUTIONAL BORON AND METHOD FOR FABRICATION THEREOF

CROSS-REFERENCE TO RELATED APPLICATIONS

This non-provisional application claims the benefit of U.S. Provisional Application No. 61/518,771 entitled "Process for Epitaxial Channel Transistors" and filed May 11, 2011, the entirety of which is hereby incorporated by reference.

TECHNICAL FIELD

The present disclosure relates in general to semiconductor manufacturing processes and more particularly to techniques to inhibit the migration of dopants including rendering boron to be substitutional.

BACKGROUND

One negative effect of transistor scaling for performance is that leakage power dramatically increases, becoming a significant design factor in advanced transistors. Transistor power dissipation at advanced nodes has shifted from mostly dynamic power dissipation to static leakage during standby modes of operation. Static leakage can now account for 40% or more of the total power consumption. Dynamic power includes switching power used for charging and discharging capacitors, and short circuit power related to nonzero rise and fall times of the input waveforms.

The subthreshold current has become the dominant leakage component for today's advanced node devices. This current is generated within the depletion region at the drain to well and source to well junctions of the device. These pn junctions are typically reverse biased allowing minority carrier drift/diffusion current, as well as electron-hole pair localized recombination. In addition, the high electric field can allow significant band-to-band tunneling current between the valence band and conduction band of the device. Subthreshold current becomes more significant as the device Vt is lowered.

As the channel length shrinks from generation to generation, Drain Induced Barrier Lowering (DIBL) also becomes a larger overall component of transistor leakage and performance degradation. In short channel devices, the electric field potential from the source and drain increases depletion in the channel, causing additional band bending which effectively lowers the device Vt, increasing subthreshold leakage current. The traditional transistor control technique to set Vt utilizes pocket (also known as "halo") implants at the source/drain edge. Such halo implants introduce dopants into the transistor channel which in turn can result in excessive variations in Vt.

BRIEF DESCRIPTION OF THE DRAWINGS

For a more complete understanding of the present disclosure, reference is made to the following description taken in conjunction with the accompanying drawings, wherein like reference numerals represent like parts, in which.

DETAILED DESCRIPTION

Precise and consistent placement of controlled quantities of dopant atoms into a semiconductor substrate is important for reliable operation of nanometer scale CMOS transistors, and in particular for transistors that are manufactured to have a substantially undoped channel (normally having an average dopant density of less than $5 \times 10^{17}$ atoms per $cm^3$) positioned under a gate dielectric between the source and the drain. Such undoped channels can be created by epitaxial growth of intrinsic silicon, growth of another compatible channel material such as silicon germanium, atomic layer deposition, or other conventional process.

A Deeply Depleted Channel (DDC) transistor uses, among other things, dopants in specific areas below an undoped channel to define a depletion zone when the transistor is turned on. There results in a transistor having improved electrical parameters including threshold voltage variation among transistors and reduced power requirements. One of the hallmarks of a DDC transistor having reduced leakage is to form the doped regions in such a manner as to inhibit the migration of the dopants outside of the desired locations.

Figure 1:
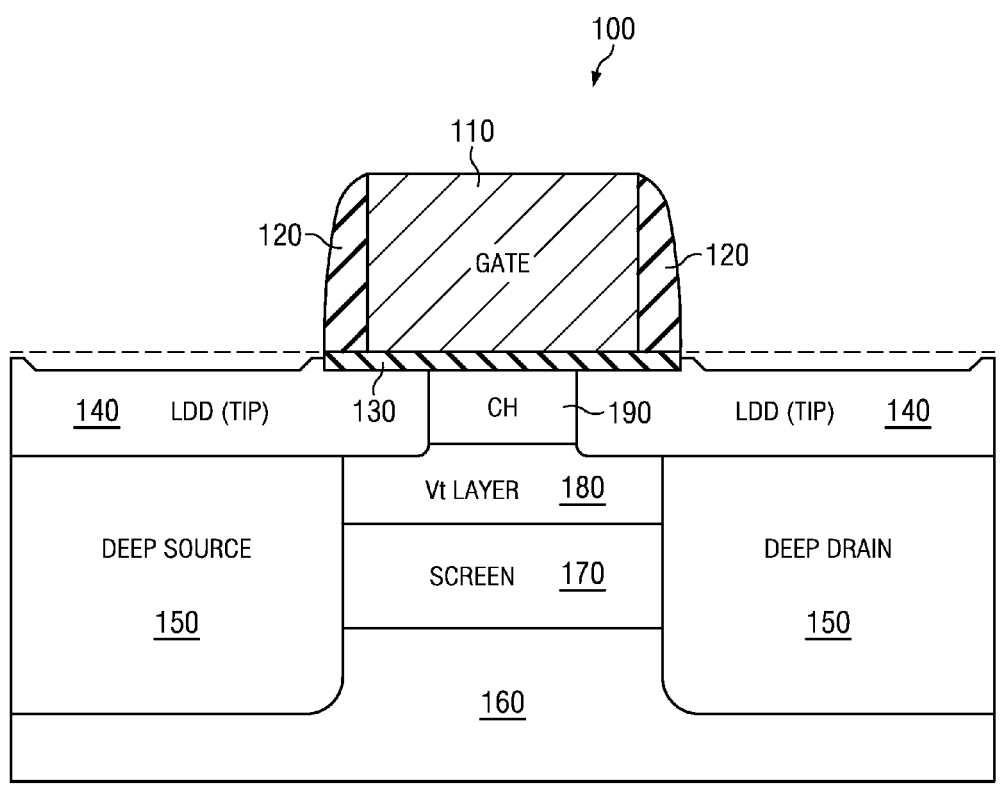
FIG. 1 illustrates a cross-sectional view of an exemplary DDC transistor.

FIG. 1 illustrates an embodiment of a Field Effect Transistor (FET), in cross-sectional view, having a substantially undoped channel. The embodiment is one example of a DDC transistor 100, which generally has the following features. There is provided a gate 110 which may be a polysilicon gate or metal gate. The gate 110 is separated from the substrate with a gate oxide 130 to form an MOS transistor. On either side of the gate edges and jutting inward within the substrate are two lightly-doped drain (LDD) regions, otherwise known as tips 140. Spacers 120 on either side of the gate 110 provide an alignment for the underlying deep source and drain 150 regions. Gate 110 with gate oxide 130 overlies a substantially undoped channel 190 that is typically a thickness of 5 to 25 nm and is typically made of epitaxially grown silicon. Transistor 100 is built starting with a doped well 160, which may include an anti-punchthrough region (not shown) having a dopant concentration that is higher than the well 160 but lower than a screening region 170. Screening region 170 sits above and optionally contacts the doped area directly below which may be well 160 with the optional anti-punchthrough region. Directly above screening region 170, there is preferably a threshold voltage control layer 180 having a dopant concentration that is less than the concentration of the screening region 170. Threshold voltage control layer 180 may be a separately formed region compared with screening region 170 or may be formed as an outgrowth from screening region 170 by way of controlled out-diffusion of dopants. The dopant species of the screening region 170 and Threshold voltage control layer 180 are of opposite type compared with the dopant species used for the source/drains 150. For purposes of the embodiments discussed herein, transistor 100 is an NFET having screening region 170 and Vt setting layer 180 doped using boron (B), though other species that are P-type can be used. Preferably, screening layer 170 is located a vertical distance separated from the gate 110 and gate oxide 130. The depth of screening layer 170 is preferably an approximate ratio of the gate length divided by M, M being a constant having a value generally between 1.5 to 5. Whereas conventional transistors utilize shallow channel implants or pocket/halo implants to set threshold voltage, DDC transistor 100 does not require either shallow channel implants or halo implants. Instead, measures are taken to avoid introduction of dopants into undoped channel 190 to ensure that undoped channel 190 is of a pre-selected thickness.

Diffusion into the substantially undoped channel 190 from underlying layers is a problem for DDC transistors in that such transistors are structured to have a highly-doped region to define the depletion width during transistor operation. Such a screening region 170 can have a dopant density as much as ten to hundred times as great as the average dopant density of the substantially undoped channel. The screening region 170 is preferably formed by implant into doped well 160 which may contain an anti-punchthrough region thereon. Alternatively, the screening layer 170 may be formed by doped epitaxial growth onto the well 160 or anti-punchthrough region, if present. The doped well 160 in turn has an average dopant density significantly less than the screening layer, typically less than one-tenth to one-fiftieth the dopant density of the screening layer 170. In certain transistor embodiments, threshold voltage of a transistor can be adjusted with the threshold voltage control layer 180 positioned between the substantially undoped channel 190 and the screening layer 170 and extending at least partially between the source and the drain 150. Preferably, screening region 170 is of a thickness such that the screening region 170 begins somewhere underneath tips 140 and ends above the bottom of the source/drain regions 150. Or, screening region 170 may be placed below the bottom of the source/drain regions 150. Such transistors are described further in pending U.S. application Ser. No. 12/708,497 filed Feb. 18, 2010, the entirety of which is hereby incorporated by reference herein.

As will be appreciated, formation of screening layer 170 and a threshold voltage control layer 180 may be performed in different ways. Screening layer 170 may be formed by way of ion implantation into well region 160 (or the anti-punchthrough region), or by way of in-situ deposition of doped material, or by way of intrinsic silicon epitaxial growth followed by ion implantation. Threshold voltage control layer 180 can either be a separate layer formed by deposition or ion implantation or may be formed by way of controlled out-diffusion of the previously formed screening layer 170. Threshold voltage control layer 180 may be formed by way of in-situ deposition of doped material or through intrinsic silicon epitaxial growth followed by ion implantation. DDC transistors 100 allow for transistor elements having differently tuned characteristics even as among transistor elements differing by type, NFET or PFET, or device type such as having low-threshold voltage, medium-threshold voltage, high-threshold voltage, or various levels therebetween. As a general matter, the relationships between structural or process parameters and electrical results are as shown in Table 1e below. Increasing undoped epi thickness trends reduced Vt but improved (reduced) Vt variation. Increased screen dose trends toward increased Vt but worsened Vt variation. Increased screen energy trends toward reduced Vt and improved (reduced) Vt variation.

TABLE 1

| Parameter | Vt | Sigma Vt |
|---|---|---|
| ↑ epi thickness | ↓↓ | ↓ |
| ↑ screen dose | ↑↑ | ↑↑ |
| ↑ screen energy | ↓ | ↓ |

Figure 2A:
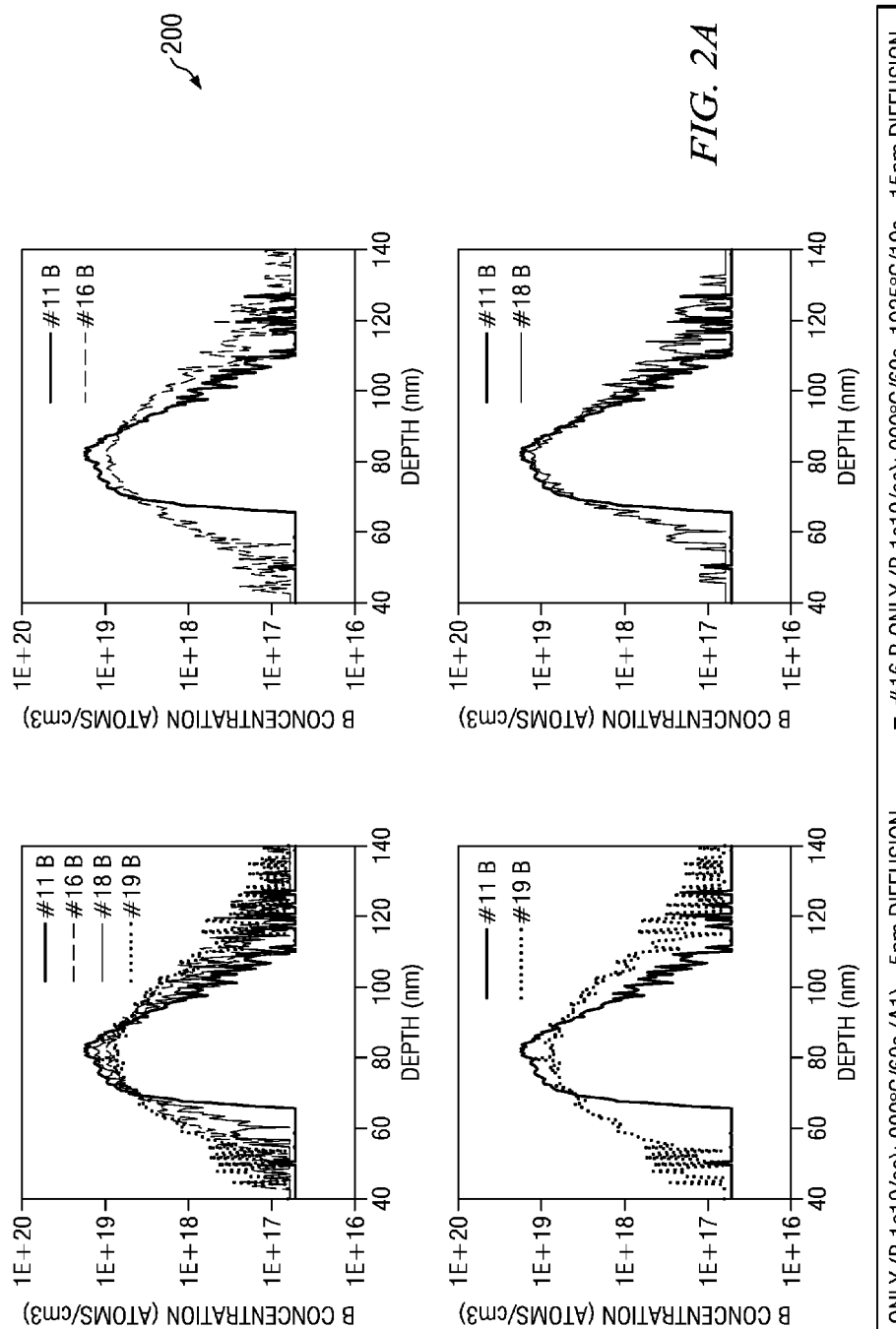
FIGS. 2A to 2D illustrate boron diffusion profiles under various conditions.
Figure 2B:
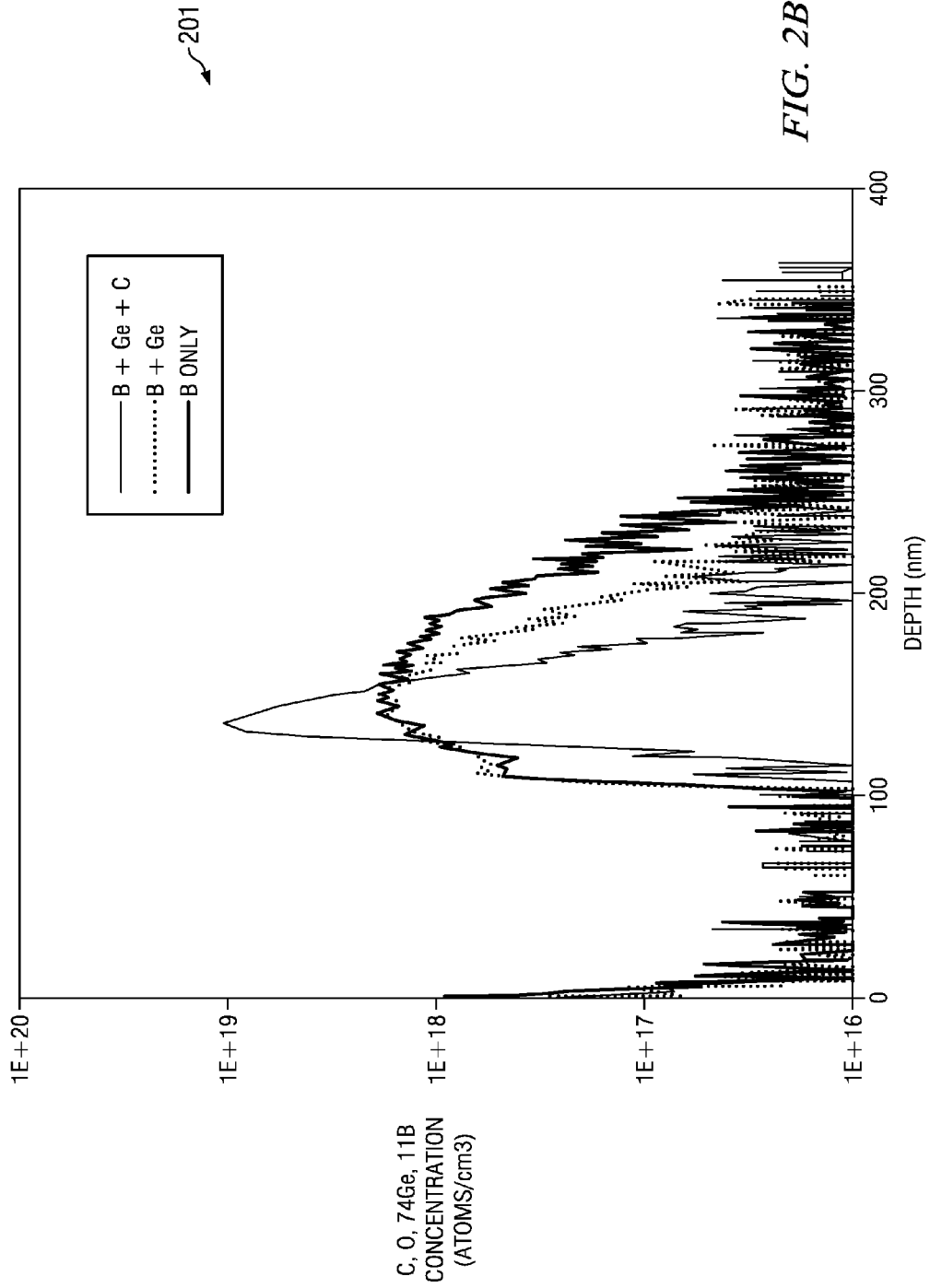

For proper transistor element operation that minimizes leakage, it is important to prevent screening layer 170 dopants and/or threshold voltage control layer 180 dopants from diffusing into substantially undoped channel layer 190 so as to reduce the effective thickness of the substantially undoped portion. This is particularly true when highly-diffusive species such as boron are used for screening layer 170 and/or Threshold voltage control layer 180 to form NFET elements. More particularly, implanted boron is known to easily diffuse during device fabrication, especially in thermal cycles of 900° C. or more. This is seen in FIG. 2A which is a chart 200 that illustrates greater diffusion at higher temperatures for the same starting point concentration of B. Such unwanted diffusion, in certain embodiments, can be limited by adding carbon or other material that effectively reduces boron diffusion rates by blocking interstitial dopant migration as shown in chart 201 of FIG. 2B.

Figure 2C:
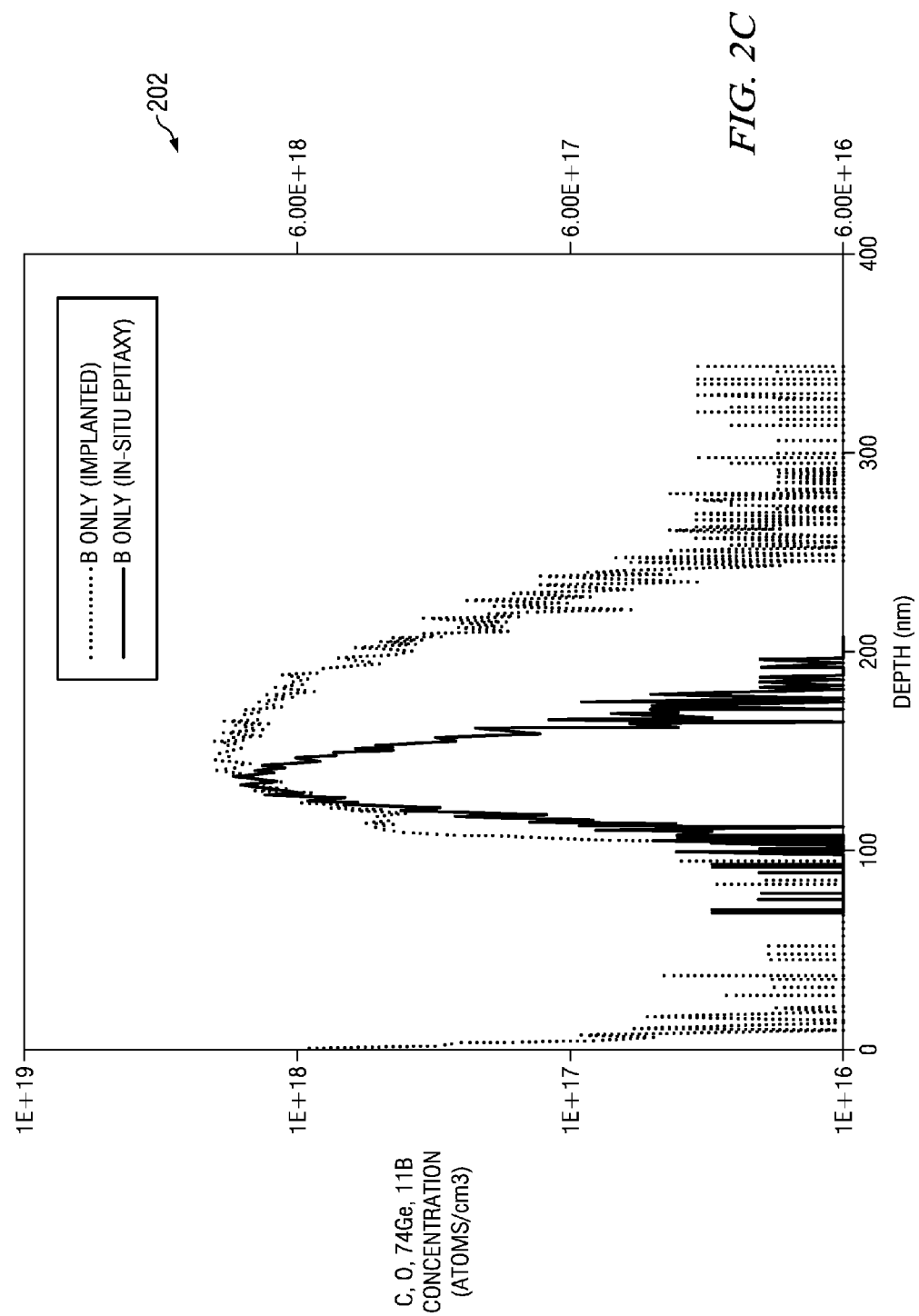

In other embodiments, boron diffusion can be reduced through growing fully substitutional boron films by epitaxy in-situ doping. FIG. 2C shows a doping profile 202 comparing implanted boron with fully substitutional (electrically active and positioned at a normal silicon lattice site) boron grown by epitaxy in-situ doping. Fully substitutional boron provides superior resistance to diffusion as a result of anneals as compared to implanted boron. An in-situ boron doped epitaxy process typically is performed in a process chamber at reduced pressure, for instance 30 to 100 Torr, and at an elevated temperature, at a range of about 600 to 800° C., in a gas mixture that includes boron material in gaseous molecular form such as diborane added to a gaseous combination of silane and hydrogen at pre-selected ratios to result in a desired deposition rate and film quality.

Limiting boron diffusion through transistor structures into a substantially undoped channel is also possible by using a brief high temperature anneal where the substrate temperature is ramped rapidly to a setpoint, such as 1000° C. and then cooled (often called a "spike" anneal). For example, a 1000° C. spike anneal can be used to activate the implanted boron and heal residual lattice damage. The spike anneal causes the implanted boron to move into substitutional sites. In another example, subjecting implanted boron to a laser anneal of 1250° C. or 1300° C. for an extremely short period of time, for instance 400 μsec, provides for boron activation and can result in implanted boron behaving like an in-situ doped epitaxial boron film with respect to resistance to diffusion.

Figure 2D:
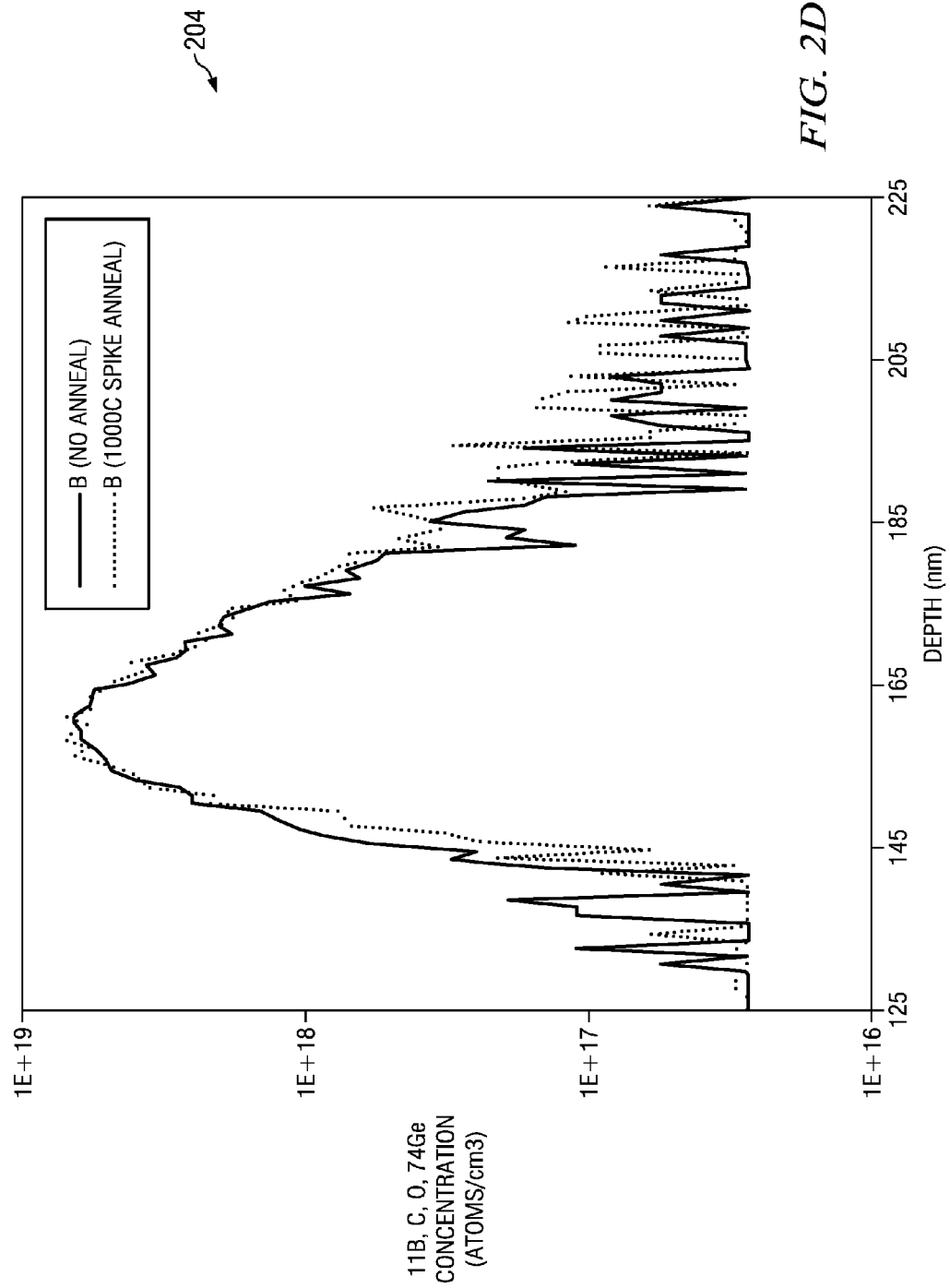

Chart 204 of FIG. 2D shows how a spike anneal before epitaxy can improve the boron profile abruptness and improve the resistance to diffusion during subsequent annealing steps. In chart 204, the spike anneal sample (dotted line) has a sharper leading edge profile that shows that it has diffused less than the reference profile (solid line data).

Several approaches may be utilized to build a transistor element with a substantially undoped channel and having a screening layer that provides a strong body effect for the device and screens the underlying well from the electric fields stemming from the gate voltage. Such a transistor element typically includes a threshold voltage control layer to set the threshold voltage for the transistor element in a manner that minimizes variation of threshold voltage from device to device, with an intrinsic channel for high mobility and reduced random dopant fluctuation performance. Each approach has various advantages and disadvantages. In general, two tradeoffs are considered when building transistor elements on a semiconductor die—the number of steps in the process (relating to manufacturing costs) and channel formation (relating to transistor performance). The fewer masking steps and total steps required to build a design translates into a lower cost to build. Forming the channel later in the thermal cycle of the manufacturing process facilitates controlling the channel doping profile and avoiding unwanted contaminants from diffusing into the channel from other parts of the transistor design.

One particular transistor having an epitaxial channel that supports a DDC transistor is described in U.S. application Ser. No. 12/708,497 titled Electronic Devices and Systems, and Methods for Making and Using the Same; in U.S. application Ser. No. 12/971,884 titled Low Power Semiconductor Transistor Structure and Method of Fabrication Thereof; in U.S. application Ser. No. 12/971,955 titled Transistor with Threshold Voltage Set Notch and Method of Fabrication Thereof; and in U.S. application Ser. No. 12/960,266 titled Semiconductor Structure and Method of Fabrication Thereof with Mixed Metal Types, the disclosures of which are hereby incorporated by reference herein in their entirety. In such transistors, the epitaxial layer thickness is a factor for setting and shifting transistor threshold voltage values, and tight control of the thickness reduces transistor variation and potential for device failure.

In the following paragraphs, reference will be made to figures that embody structures formed in a semiconductor substrate at individual steps in a fabrication process. Reference is generally made to the fabrication steps. Exemplary process conditions are described in reference to the flowcharts start at FIG. 6 below.

Figure 3A:
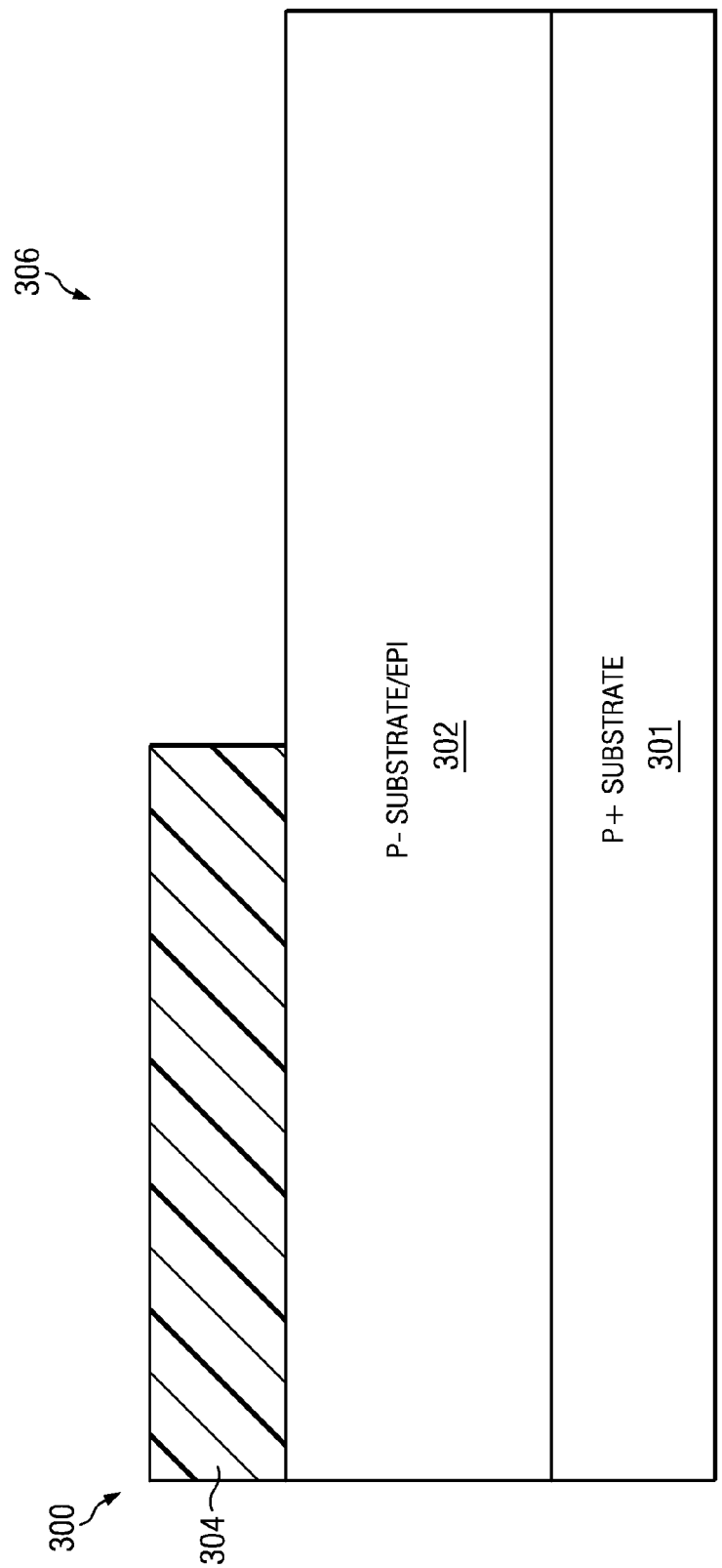
FIGS. 3A to 3K illustrate a fabrication process for a semiconductor transistor structure using boron dopants, a blanket deposited epitaxial channel, and a shallow trench isolation last approach.
Figure 3B:
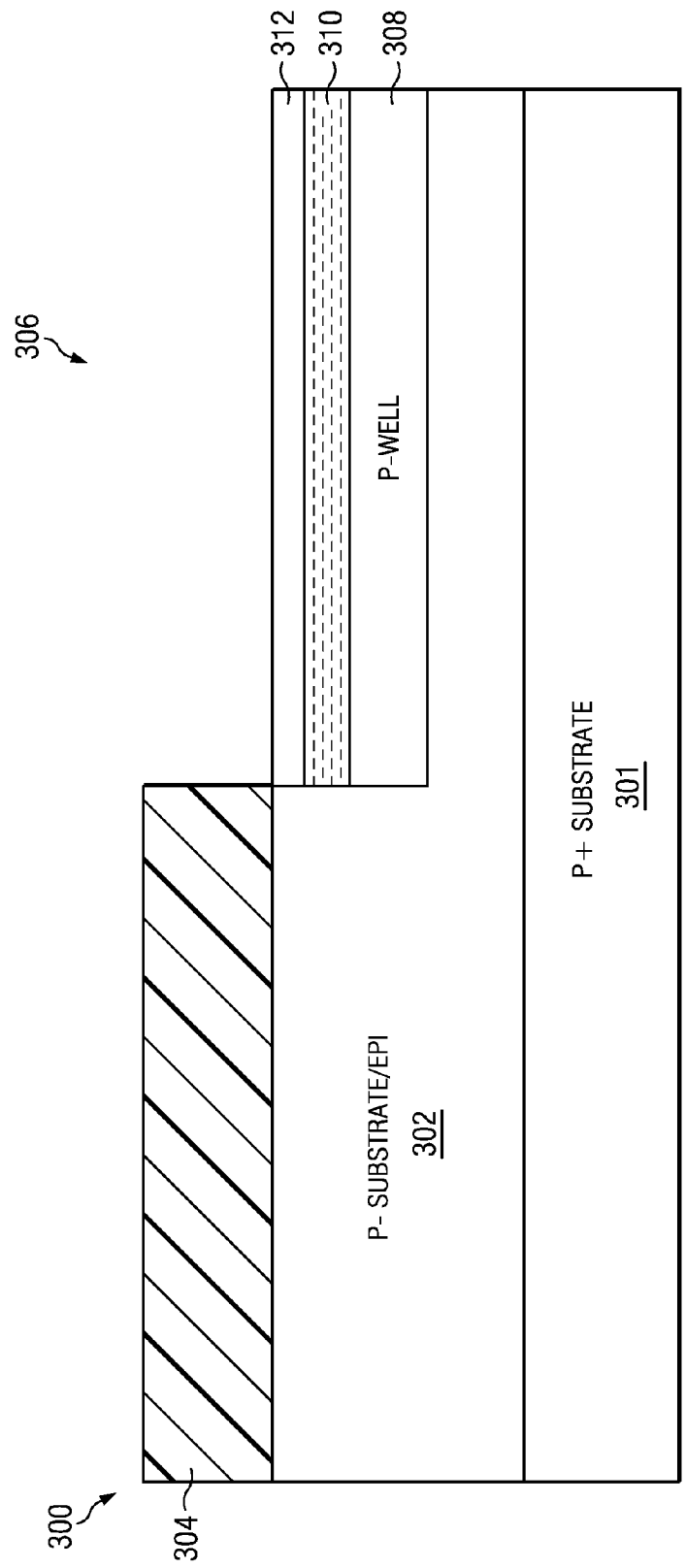

FIGS. 3A to 3K show an embodiment that includes blanket channel and shallow trench isolation last, for forming a structure 300 having transistor elements with a three layer stack to optimize overall transistor performance. The process begins in FIG. 3A with a P+ substrate 301 which may include a P− silicon epitaxy layer 302 formed thereon and used for structure 300. Initial patterning is performed by forming a mask 304 preferably of photoresist and etching away desired portions of the mask 304 to expose an area 306 for a first transistor element, in this instance a NFET. In FIG. 3B, ion implantation is performed to create a p-well region 308. Another ion implantation is performed to create a screening layer 310. Another ion implantation may be performed to create a threshold voltage control layer 312. Alternatively, threshold voltage control layer 312 may be formed through diffusion from screening layer 310. Note that the well 308 can also include optional anti-punchthrough implants (not shown) to help protect against deep source/drain punchthrough current.

Figure 3C:
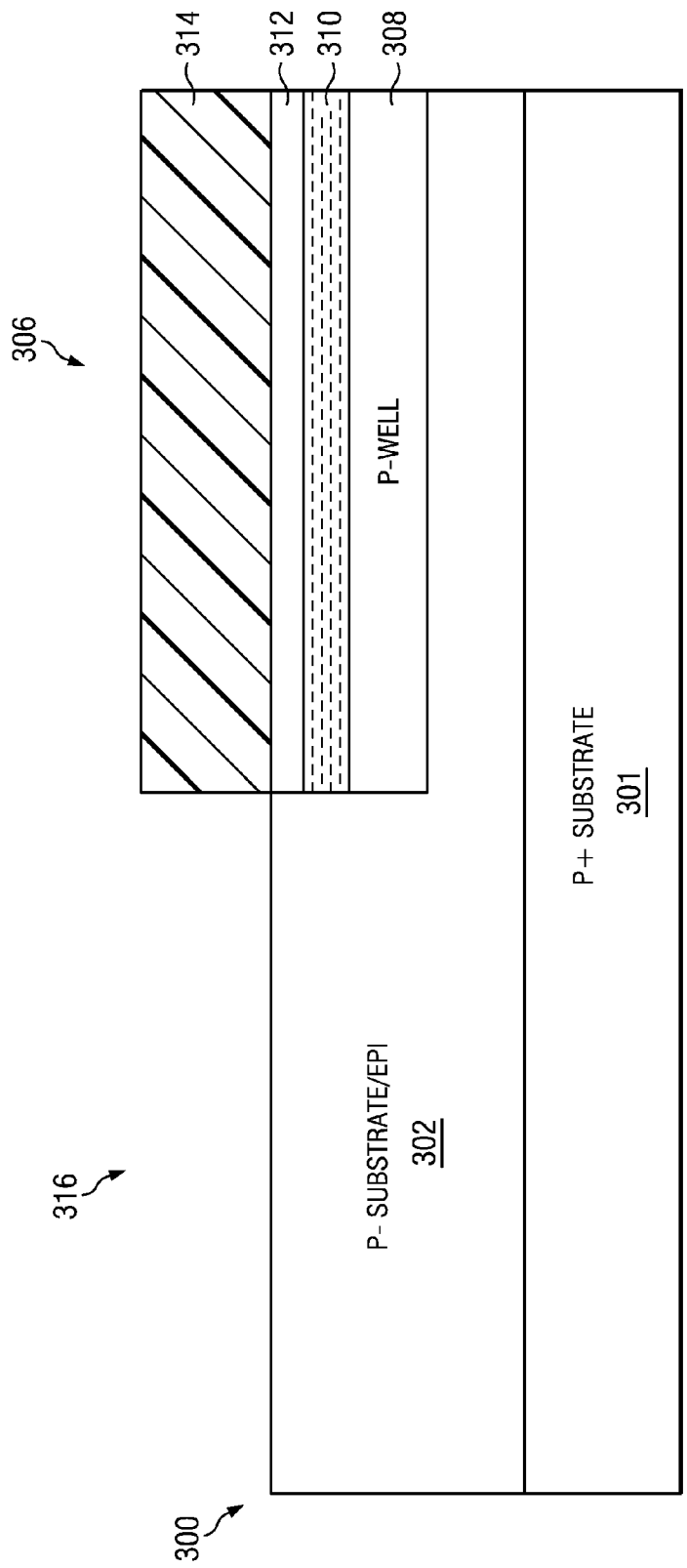
Figure 3D:
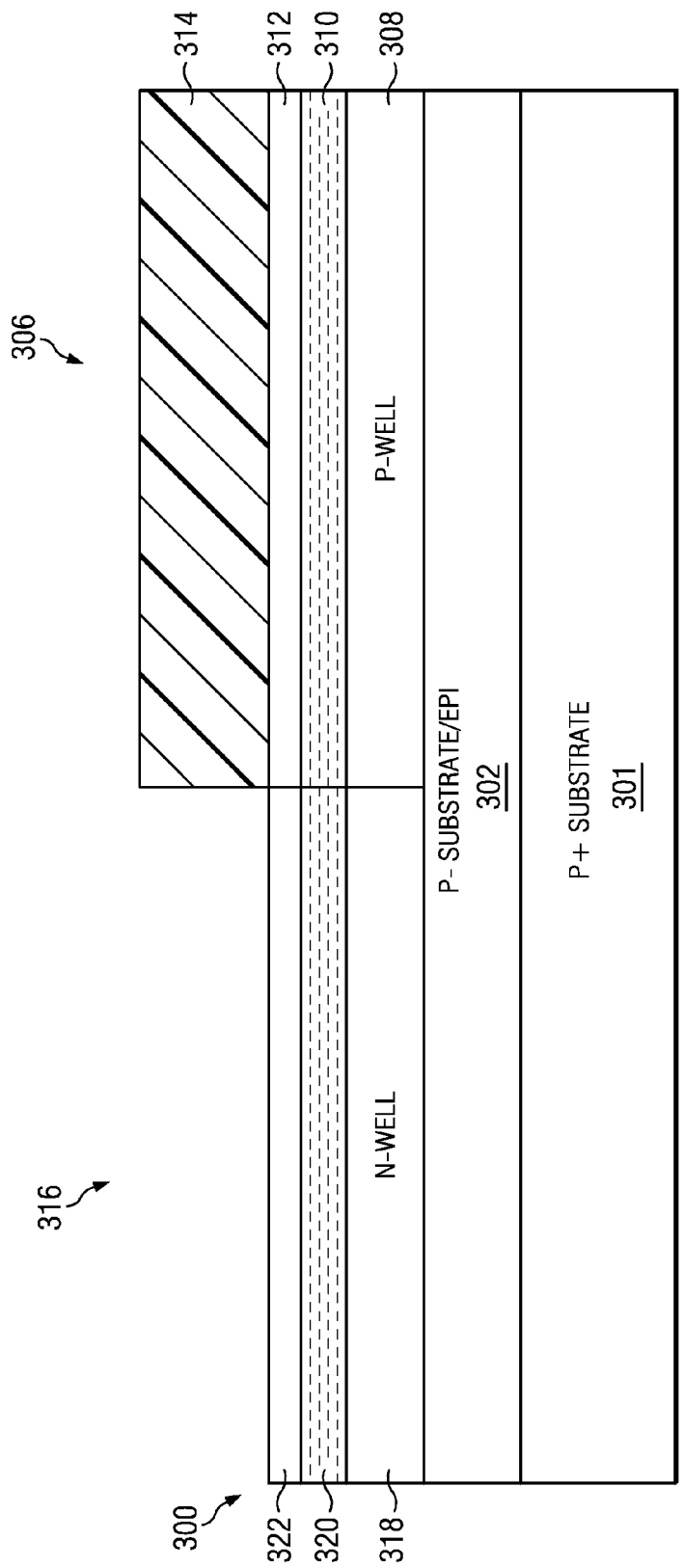

In FIG. 3C, mask layer 304 is removed and a new mask 314, preferably photoresist, is patterned to expose an area 316 for a second transistor element, in this instance a PFET. In FIG. 3D, ion implantation is performed to create well 318 and a screening layer 320. Another ion implantation may be performed to create a threshold voltage control layer 322. Alternatively, threshold voltage control layer 322 may be formed through diffusion from screening layer 320. At least one of screening layer 320 and threshold voltage control layer 322 is to be formed with substitutional boron. Note that the well 318 can also include optional anti-punchthrough implants (not shown) to help protect against deep source/drain punchthrough current.

Figure 3E:
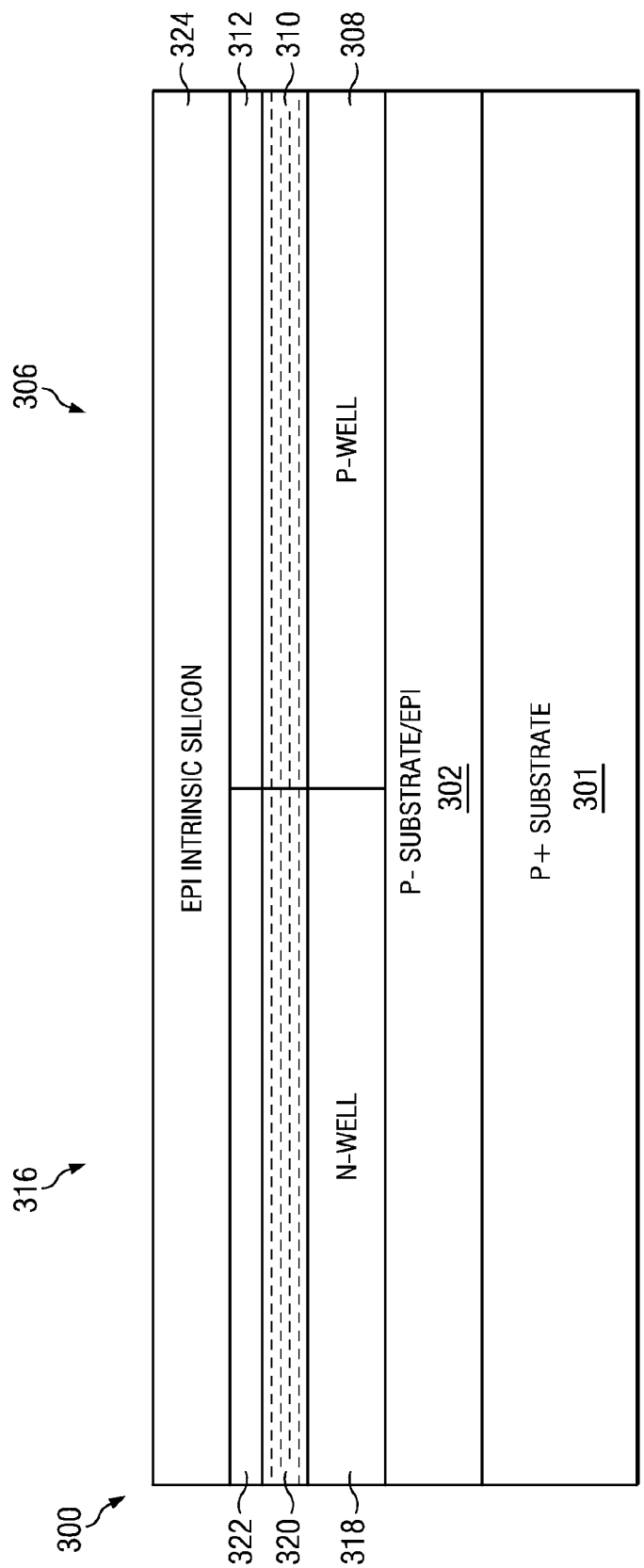
Figure 3F:
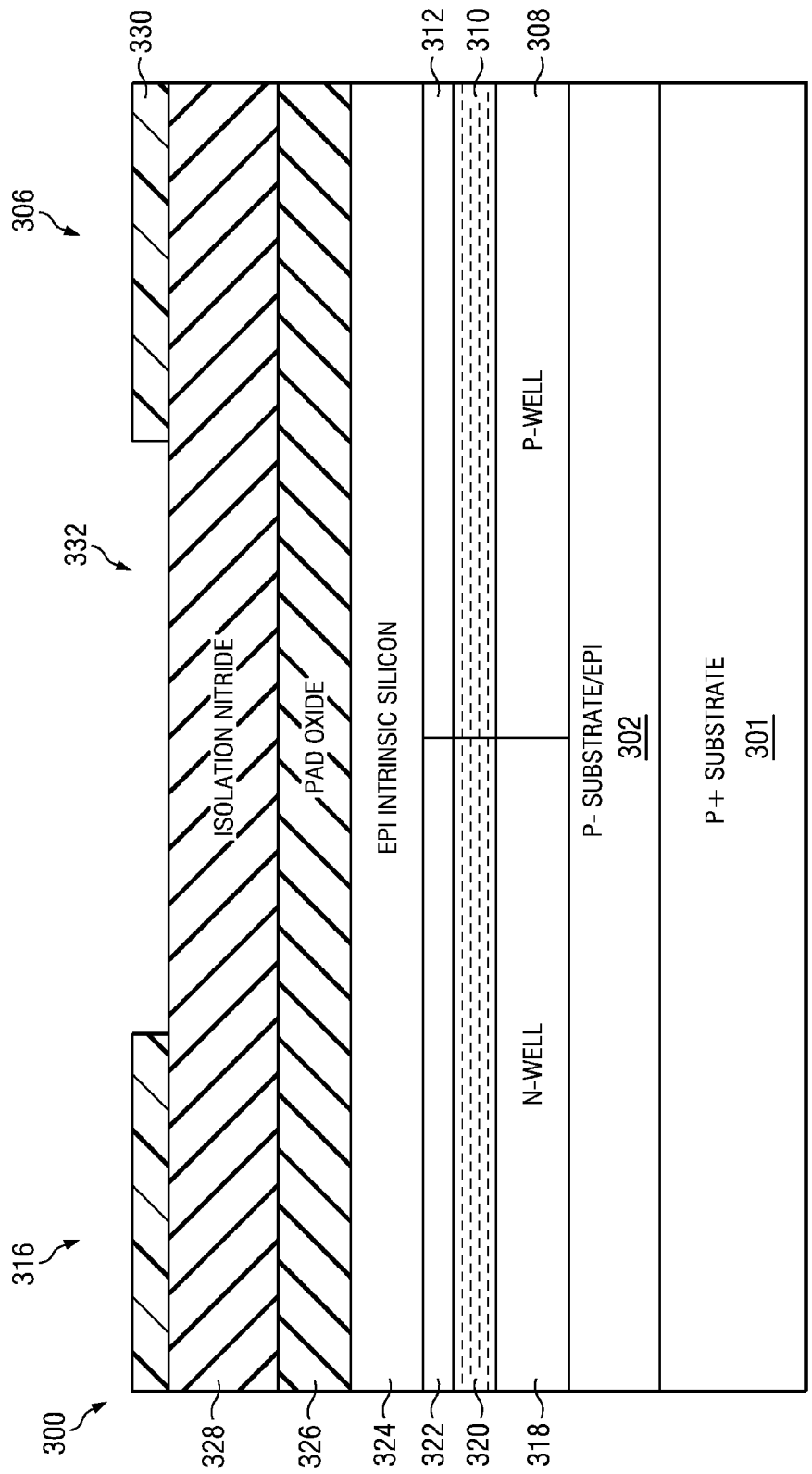

In FIG. 3E, photoresist layer 316 is removed and an epitaxial layer 324 of intrinsic silicon is grown across PFET 316 and NFET 306. Epitaxial layer 324 becomes the substantially undoped channel for each of PFET 316 and NFET 306. In FIG. 3F, the initial steps for isolating NFET 306 from PFET 316 are preferably performed by depositing a pad oxide layer 326 on epitaxial layer 324, depositing a nitride layer 328 on pad oxide layer 326, and patterning a photoresist mask 330 to leave an exposed area 332 for a shallow trench isolation region.

Figure 3G:
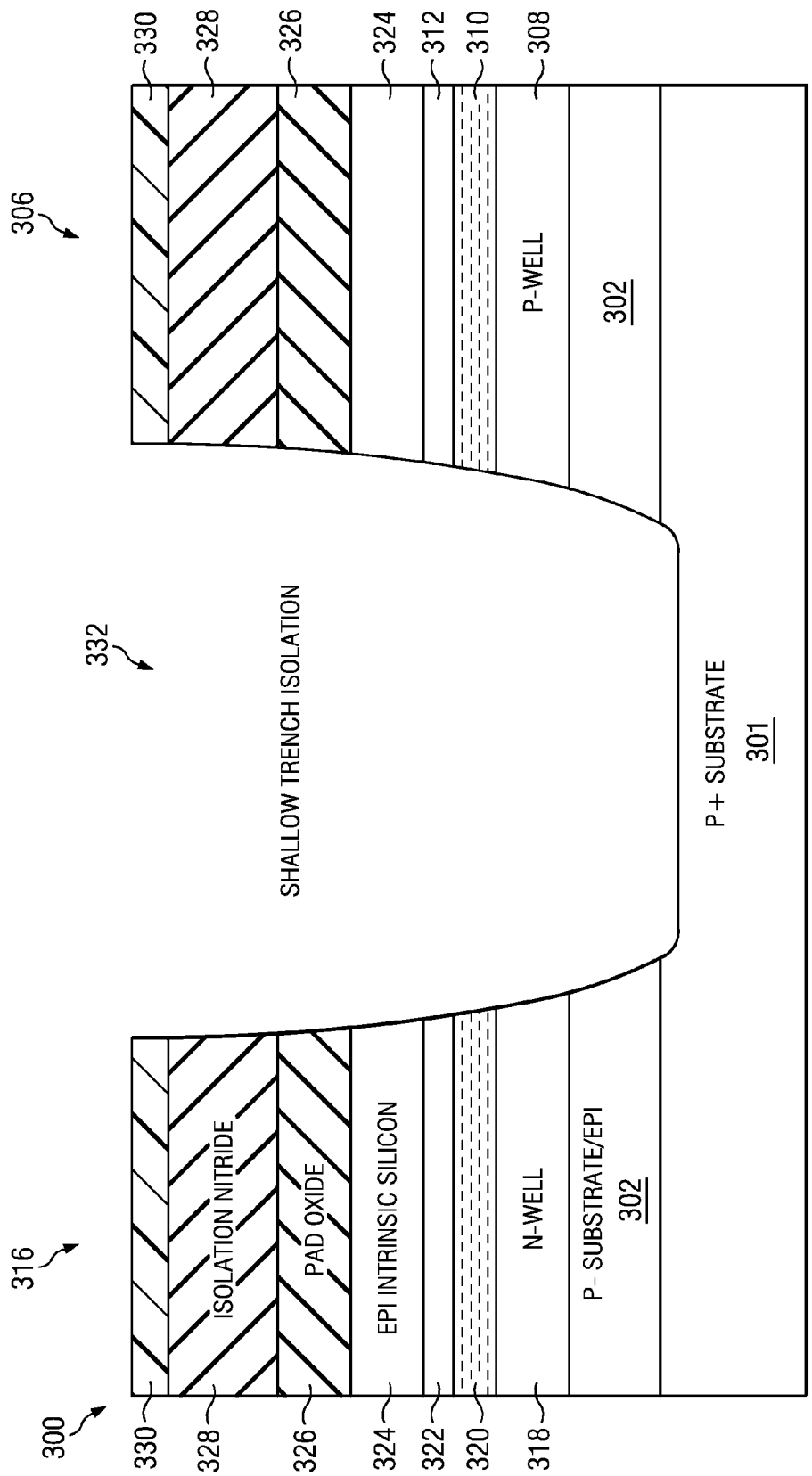
Figure 3H:
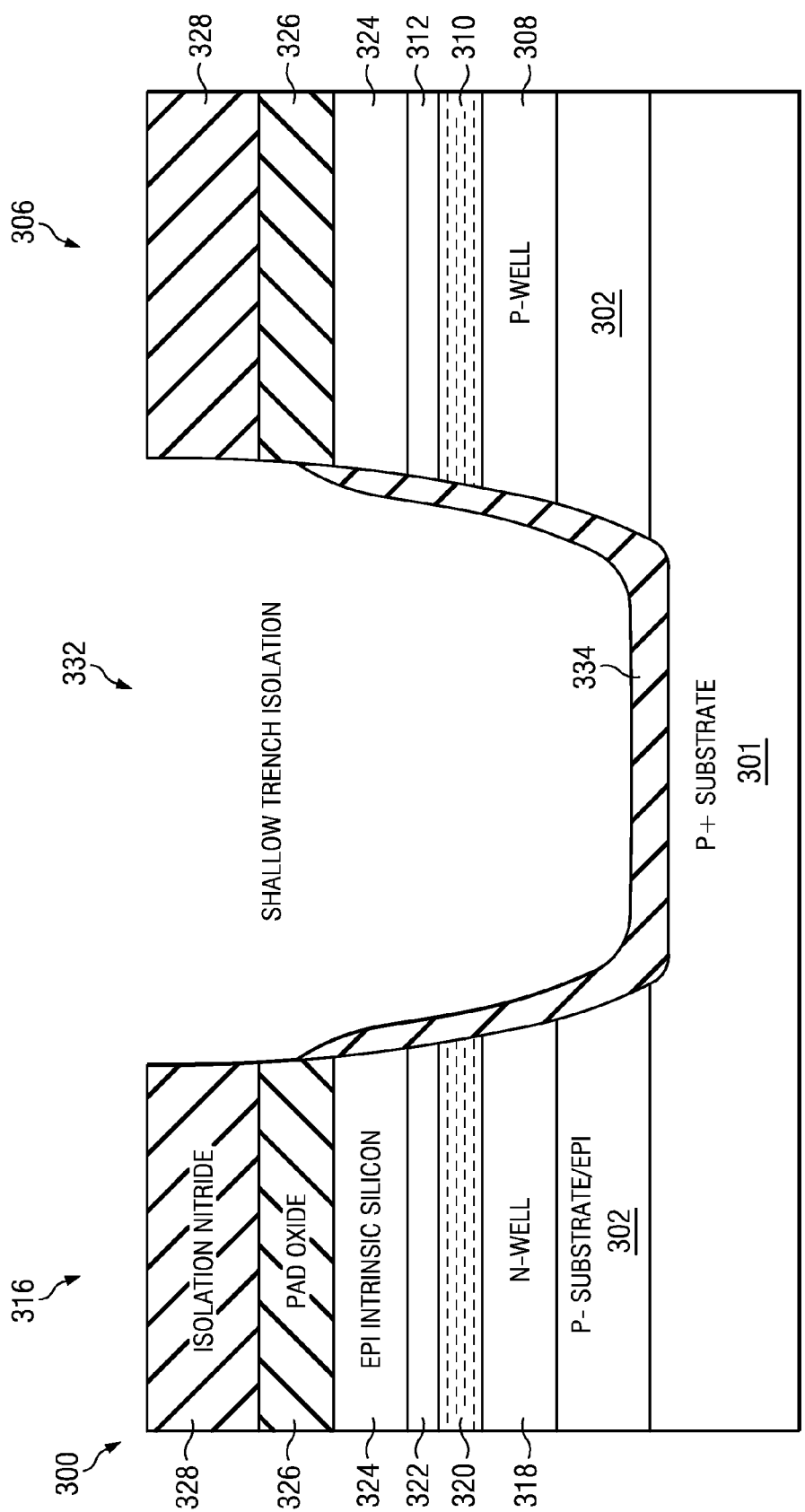

In FIG. 3G, portions of nitride isolation layer 328, pad oxide layer 326, epitaxial layer 324, threshold voltage control layers 312 and 322, screening layers 310 and 320, n-well region 318, p-well region 308, and silicon epitaxy layer 302 and substrate 301 are etched away in area 332 to leave a trench. In FIG. 3H, photoresist mask 330 is removed and an oxide or oxynitride liner 334 is grown in the trench.

Figure 3I:
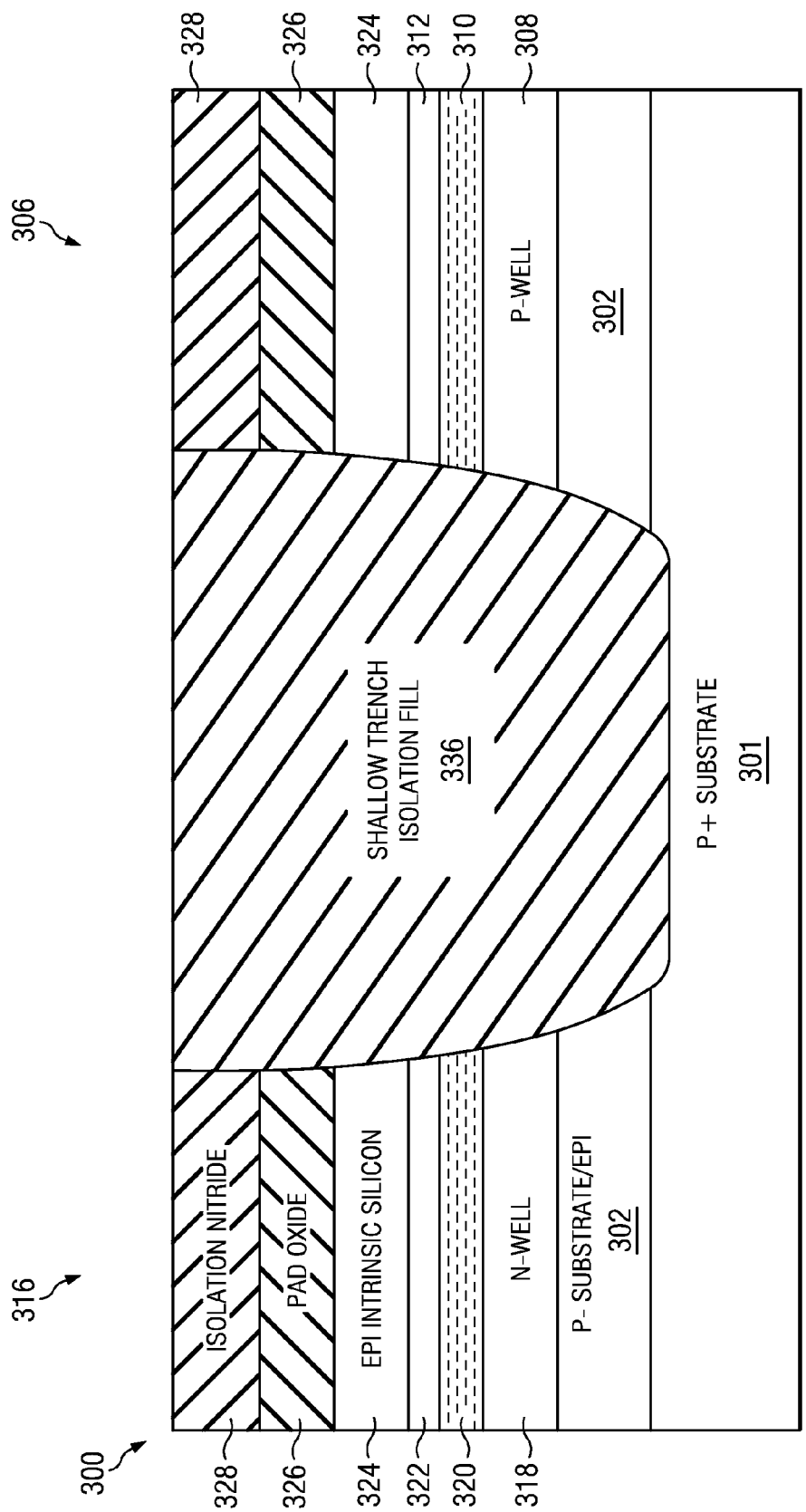
Figure 3J:
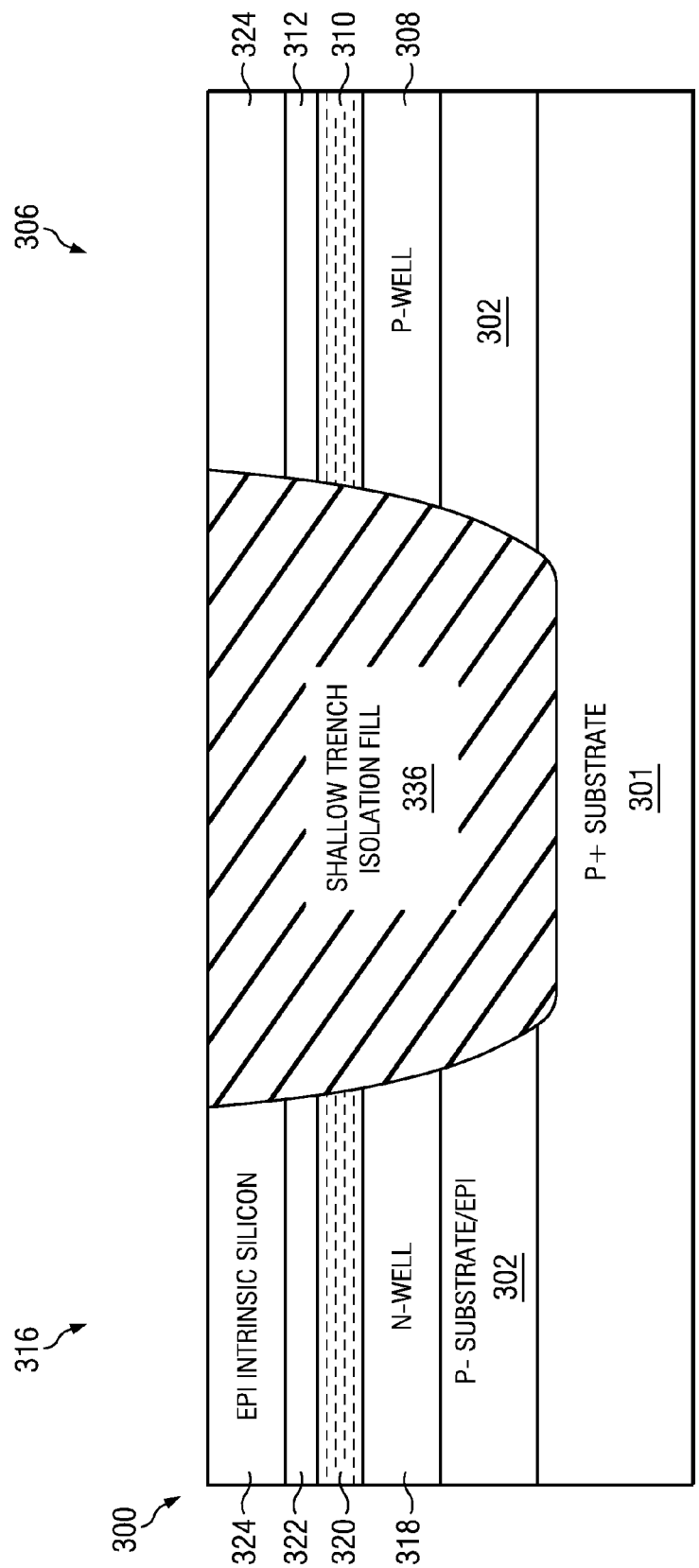
Figure 3K:
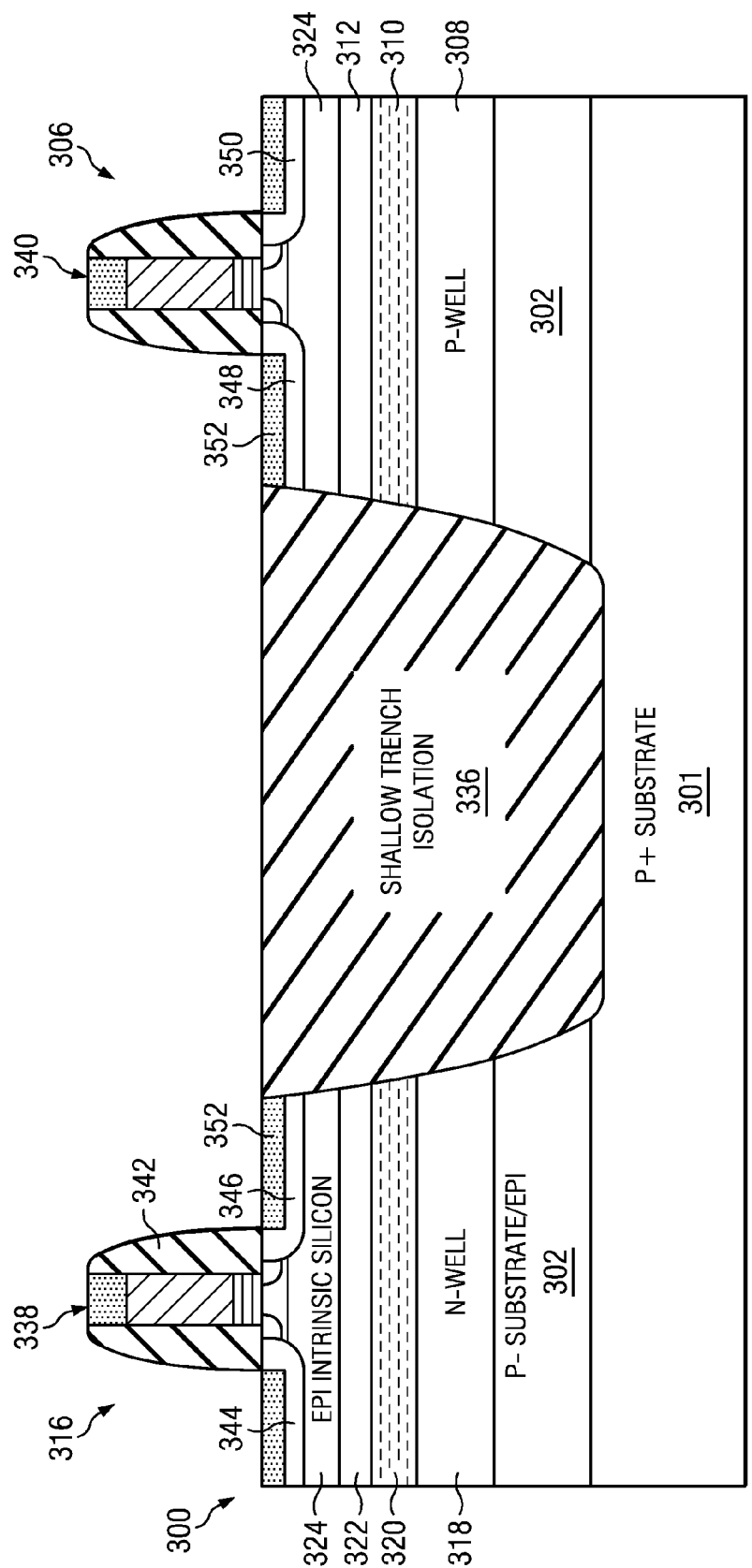

In FIG. 3I, the trench is filled with a dielectric material such as HDP or SACVD oxide to establish shallow trench isolation region 336. A re-flow anneal is performed to minimize voids in structure 300 and an optional curing anneal may be performed to densify and harden structure 300 and create desired stress therein. A planarization process is then performed down to nitride isolation layer 328. In FIG. 3J, nitride isolation layer 328 and pad oxide layer 326 are etched away, and the trench fill material is planarized down to the surrounding structure height. In FIG. 3K, PFET 316 and NFET 306 are completed using CMOS gate stack 338 and 340 formation with spacers 342, source/drain formations (344, 346, 348, and 350 along with source/drain extensions, and silicide formation 352.

Figure 4A:
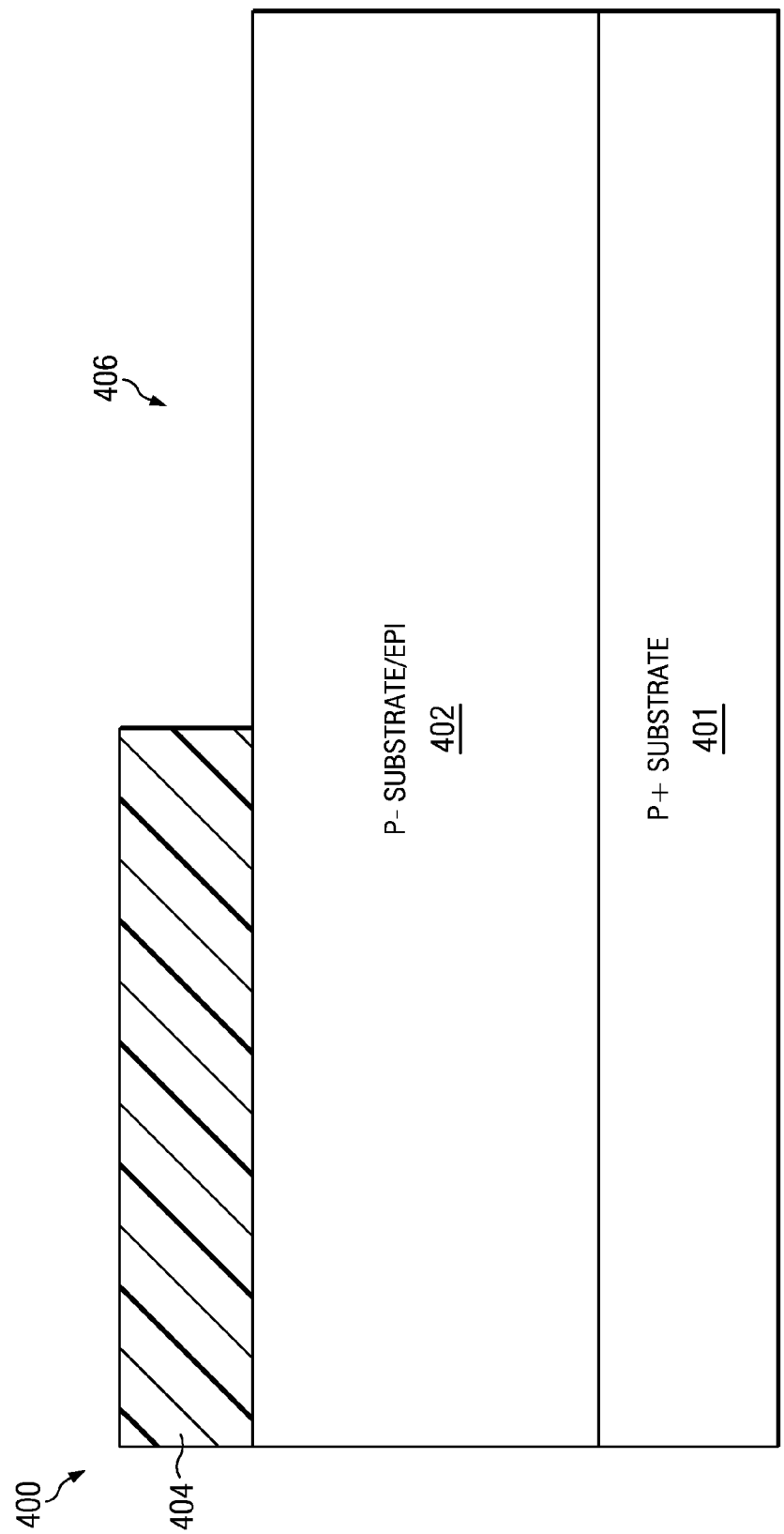
FIGS. 4A to 4I illustrate a fabrication process for a semiconductor structure with multiple blanket epitaxial layers and shallow trench isolation last approach.
Figure 4B:
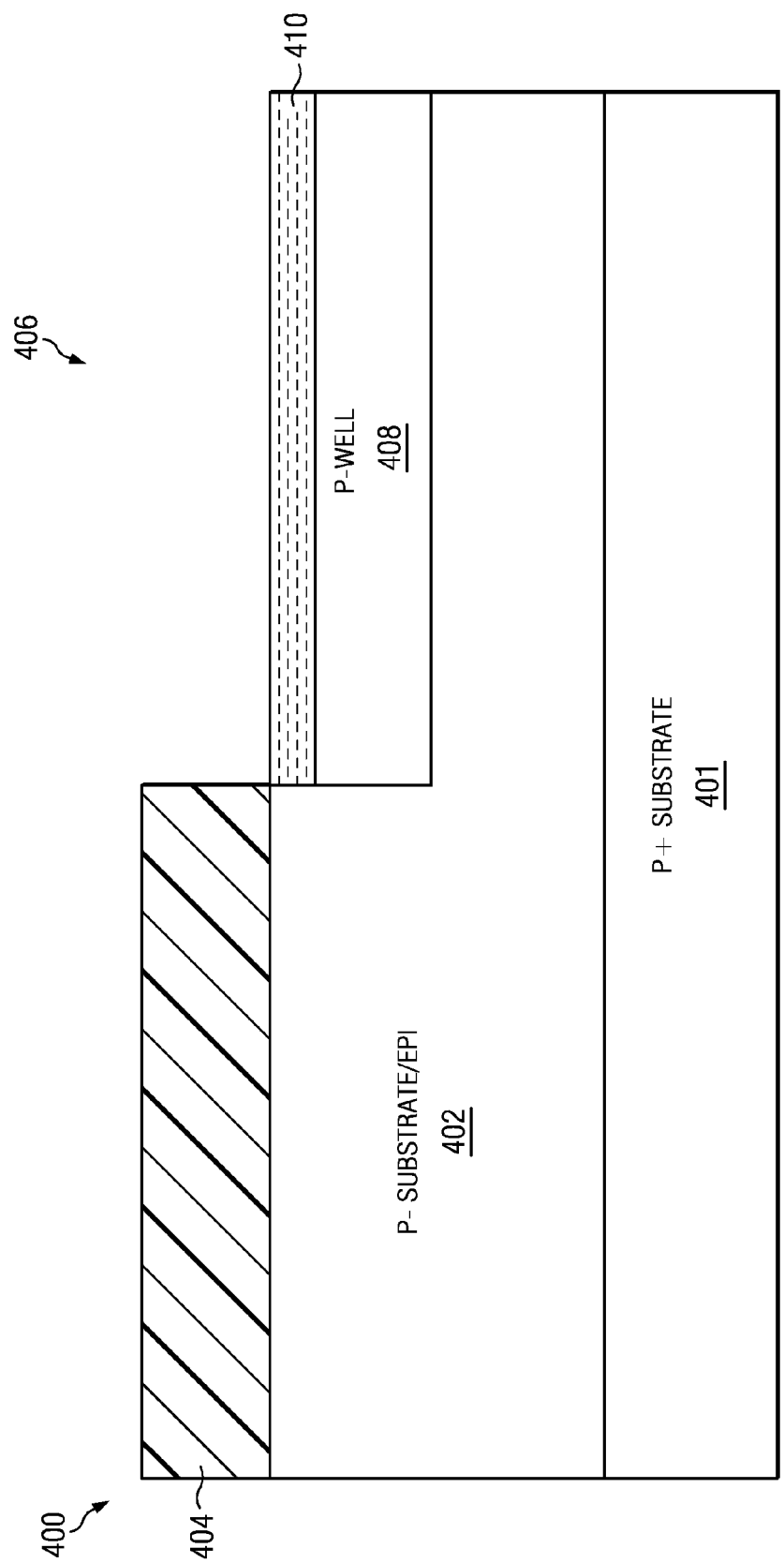

FIGS. 4A to 4I show a multiple blanket epitaxial layer and shallow trench isolation last approach for forming a structure 400 having transistor elements with the three layer stack including a substantially undoped channel to optimize overall transistor performance. The process begins in FIG. 4A with a P+ substrate 401 which may include a P− silicon epitaxy layer 402 formed thereon and used for structure 400. Initial patterning is performed by forming a photoresist mask 404 and etching away desired portions of the photoresist mask 404 to expose an area 406 for a first transistor element, in this instance an NFET. Optionally, a blanket screening layer (not shown) may be epitaxially grown or deposited on structure 400 prior to patterning of photoresist mask 404. In FIG. 4B, ion implantation is performed to create a p-well region 408. Another ion implantation is performed to create a screening layer 410, either in p-well region 408 or in the portion of the optional blanket epitaxial layer associated with NFET element 406. An optional deep anti-punchthrough layer (not shown) can be added below the screening layer 410 to protect against source/drain punchthrough.

Figure 4C:
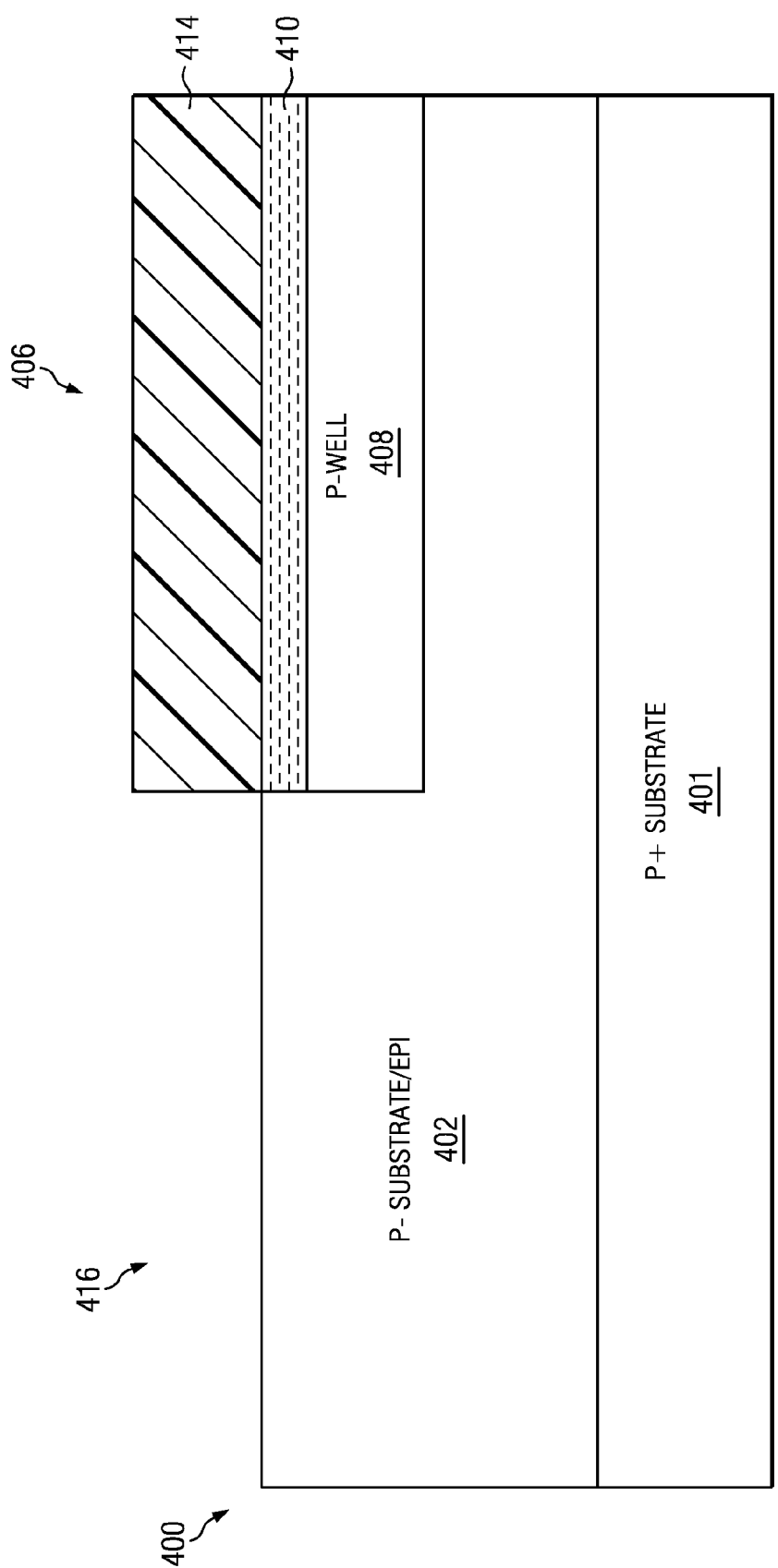
Figure 4D:
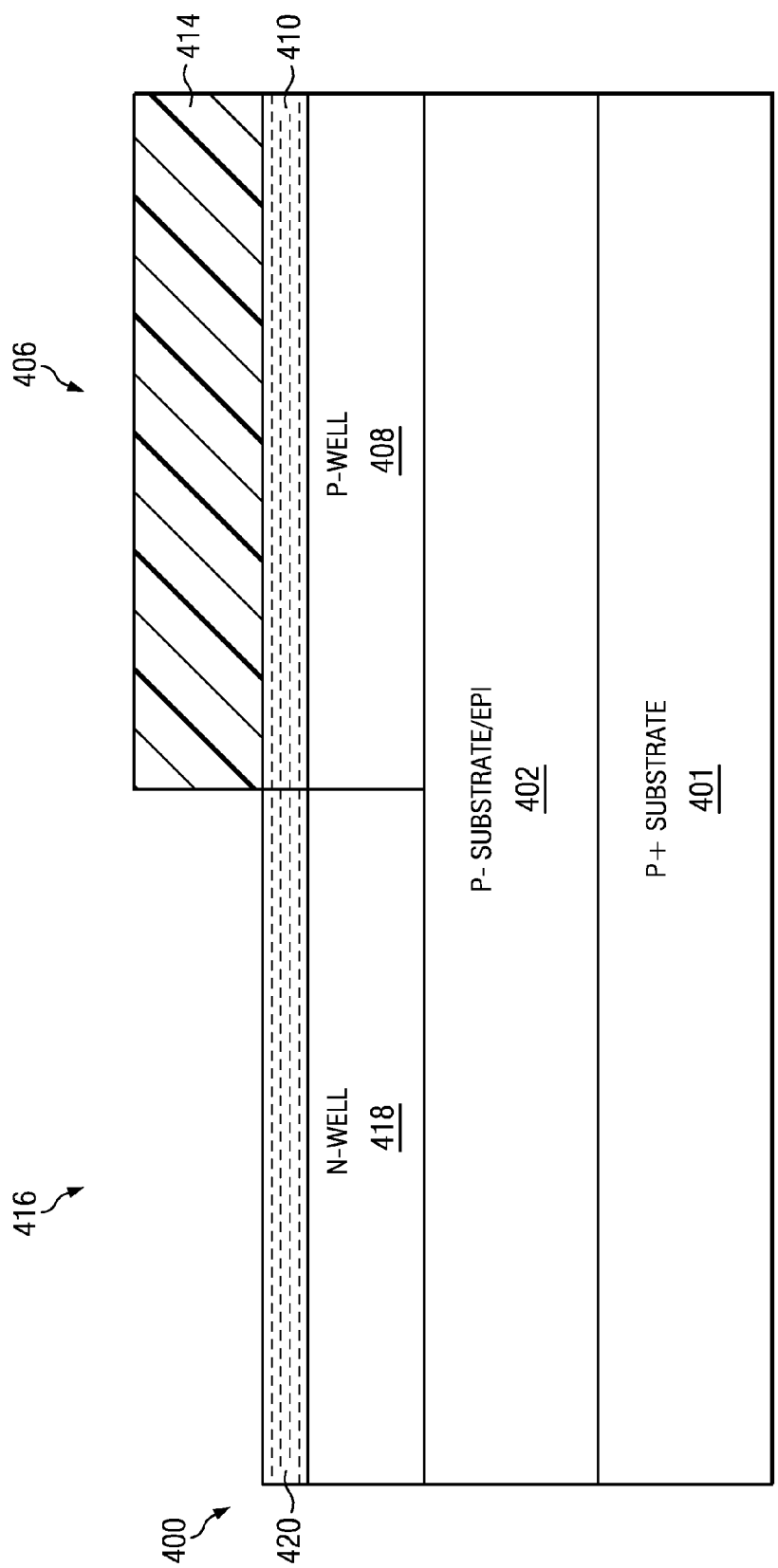

In FIG. 4C, photoresist layer 404 is removed and a new photoresist layer 414 is patterned to expose an area 416 for a second transistor element, in this instance a PFET. In FIG. 4D, ion implantation is performed to create an n-well region 418. Another ion implantation is performed to create a screening layer 420, either in n-well region 418 or in the portion of the optional blanket epitaxial layer associated with PFET element 416.

Figure 4E:
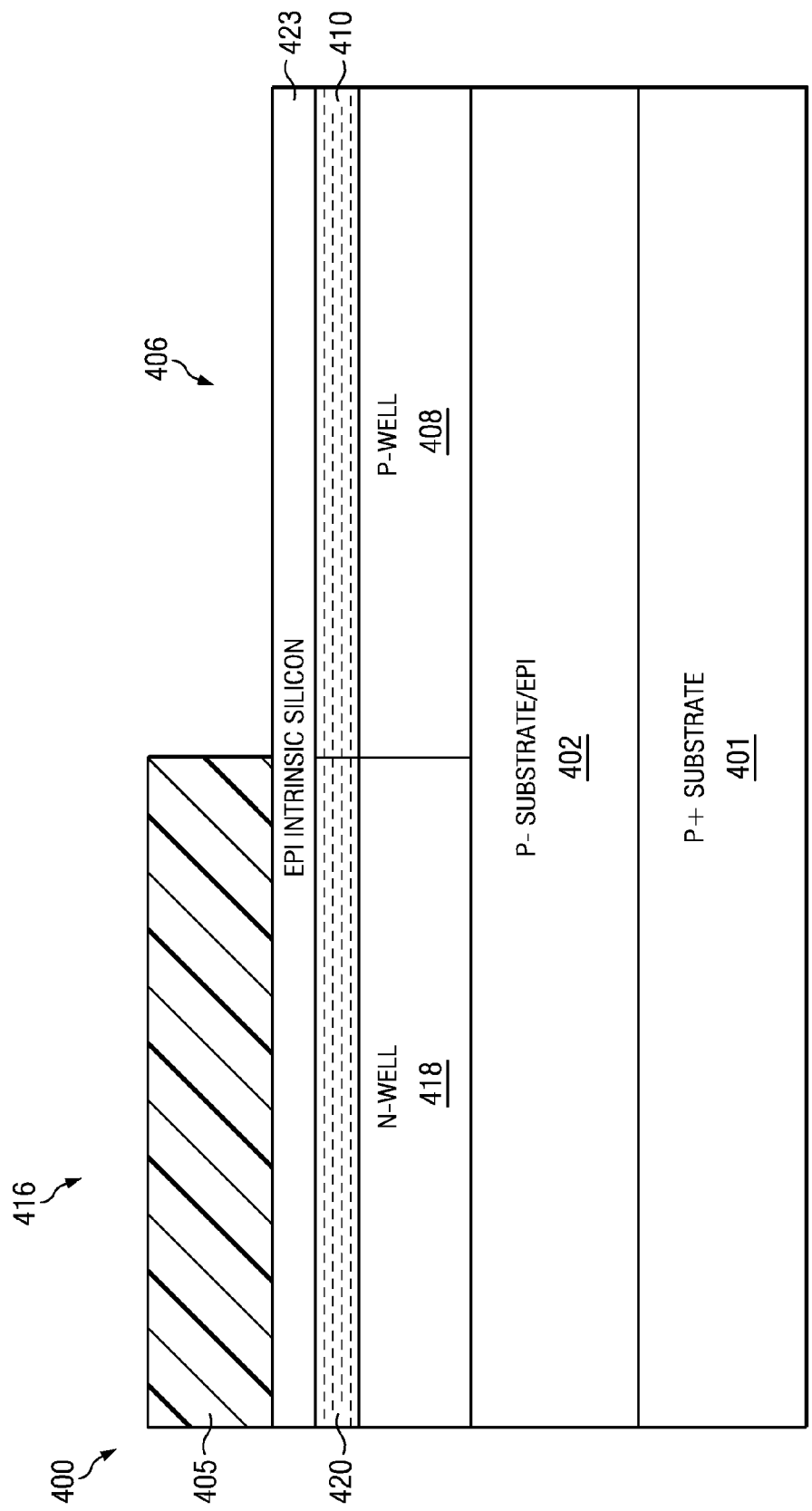
Figure 4F:
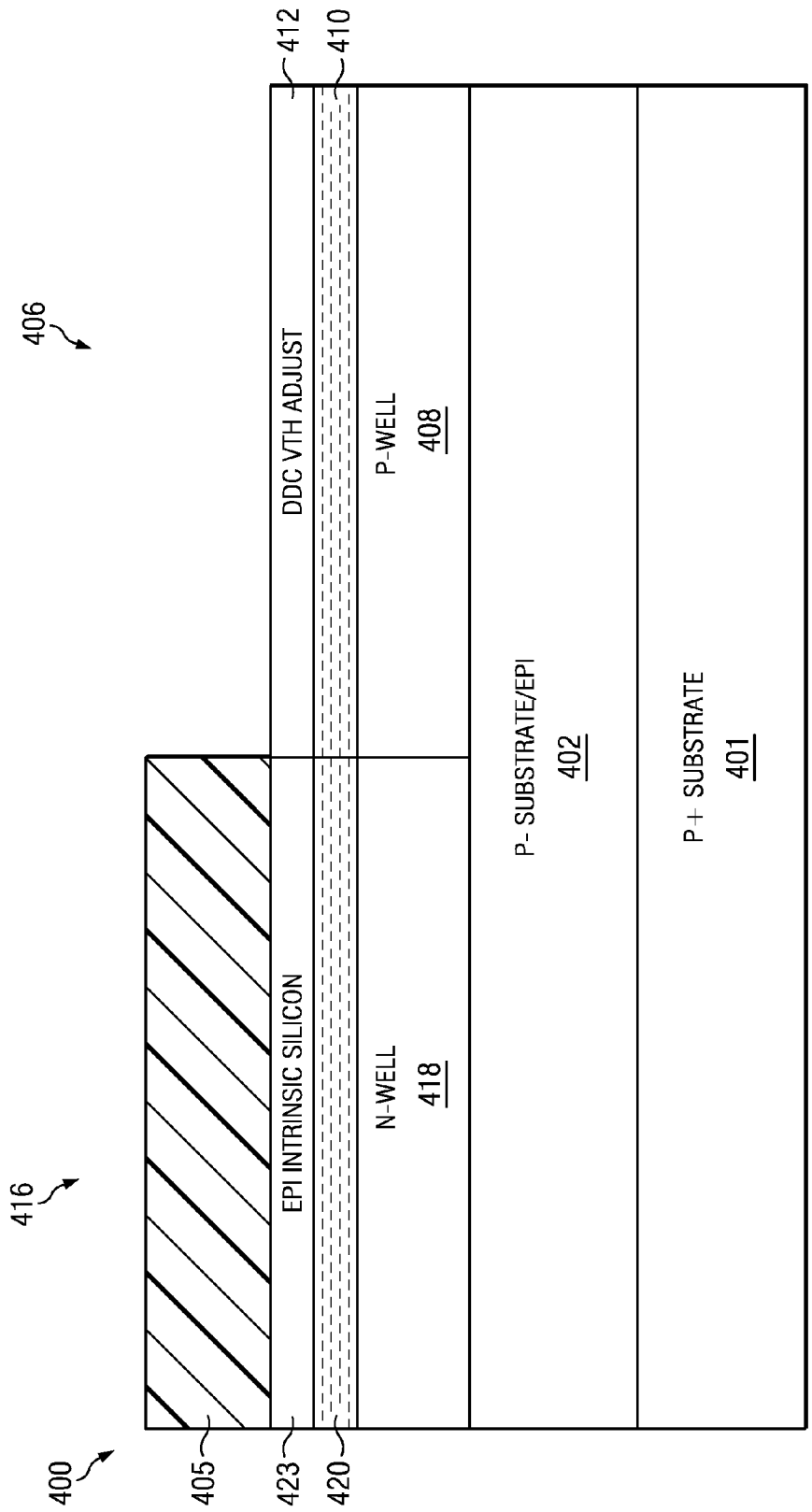

In FIG. 4E, photoresist layer 414 is removed and an epitaxial layer 423 of intrinsic silicon is grown across PFET 416 and NFET 406. Epitaxial layer 423 will in a subsequent step become separate threshold voltage control layers 422 and 412 respectively for each of PFET 416 and NFET 406. A new photoresist layer 405 is patterned to expose NFET 406. In FIG. 4F, the exposed portion of epitaxial layer 423 may be subjected to ion implantation to create threshold voltage control layer 412 for NFET 406.

Figure 4G:
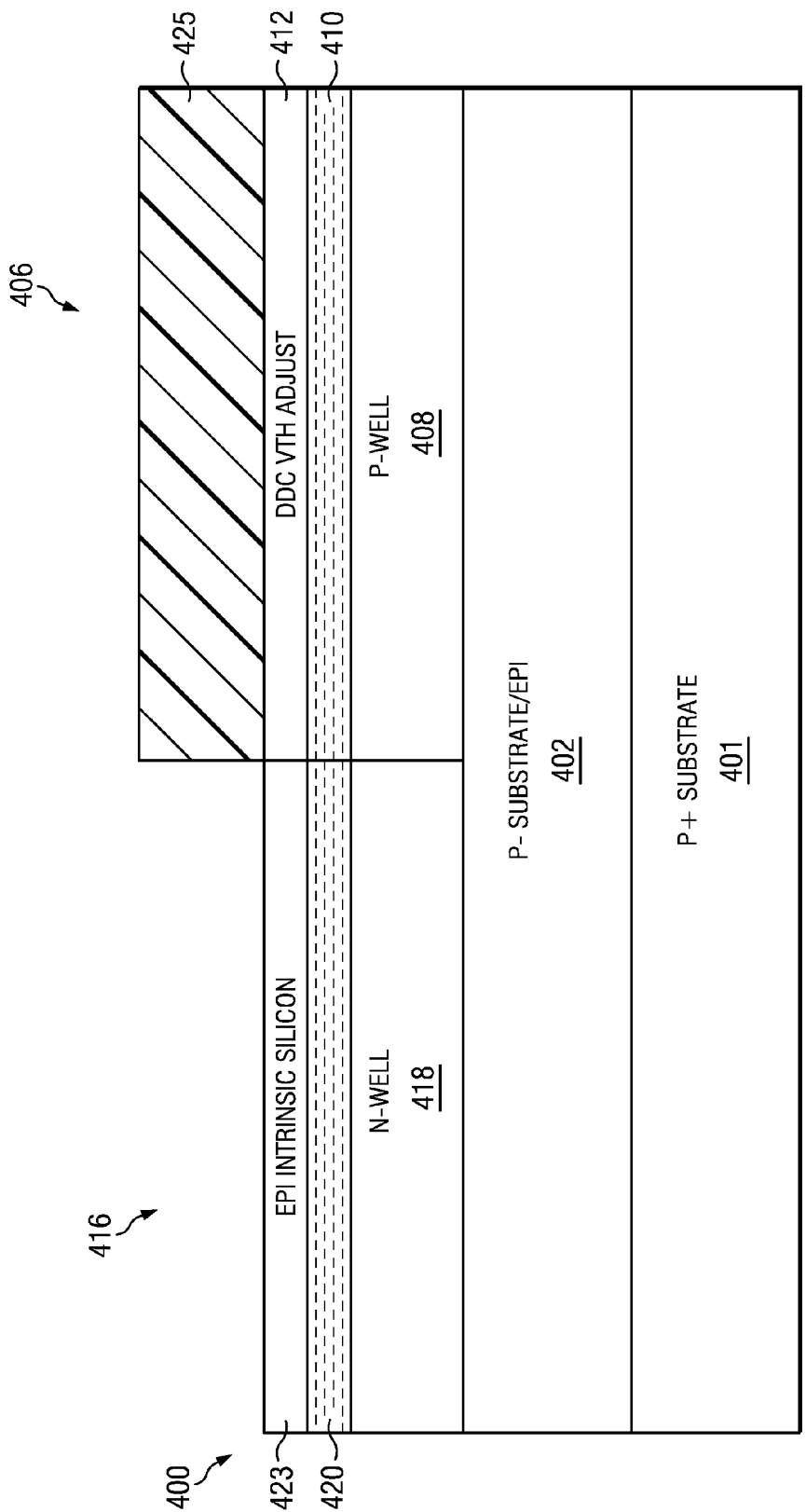
Figure 4H:
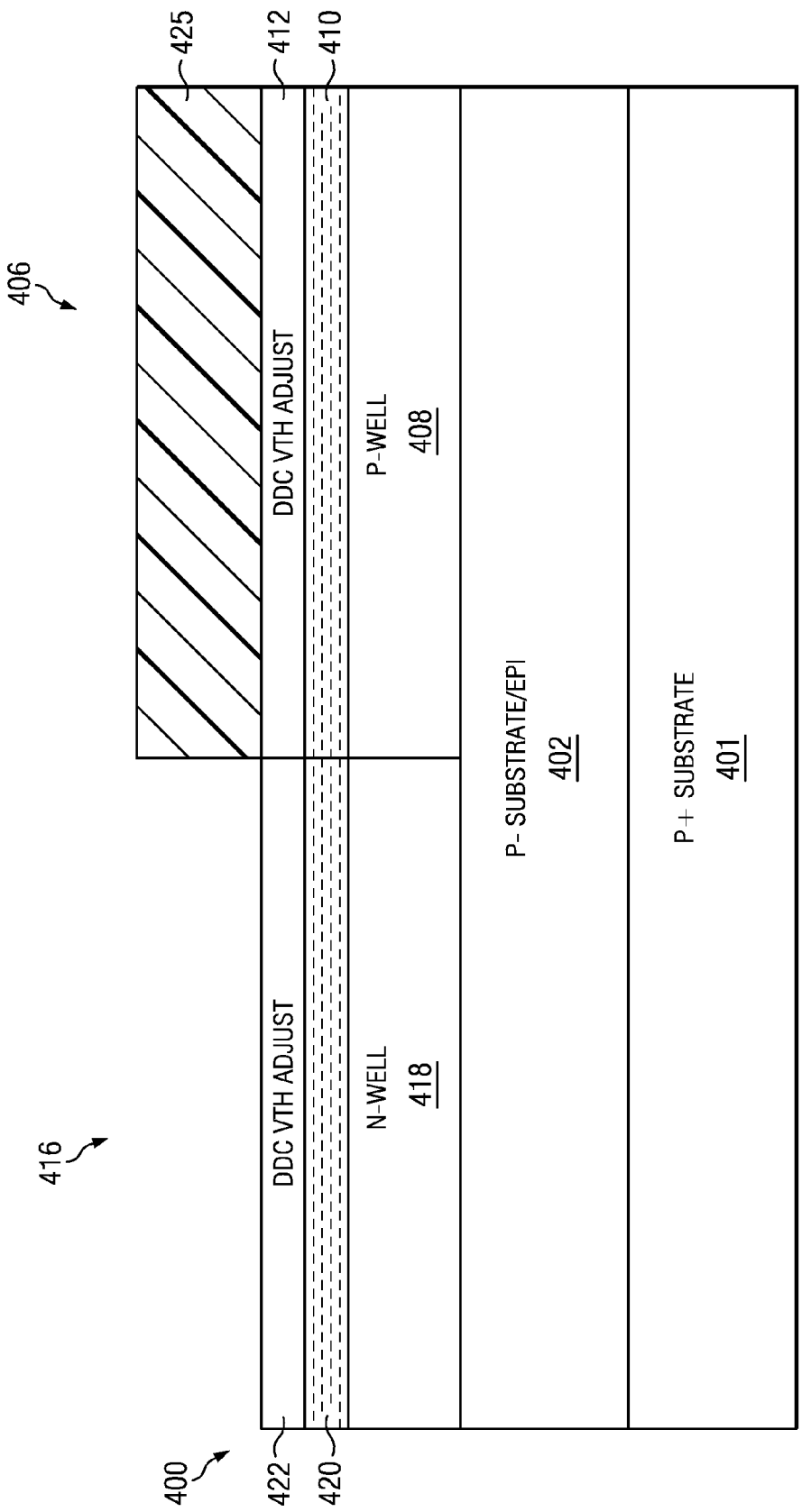

In FIG. 4G, photoresist layer 405 is removed and a new photoresist layer 425 is patterned to expose PFET element 416. In FIG. 4H, the exposed portion of epitaxial layer 423 may be subjected to ion implantation to create threshold voltage control layer 422 for PFET 416.

Figure 4I:
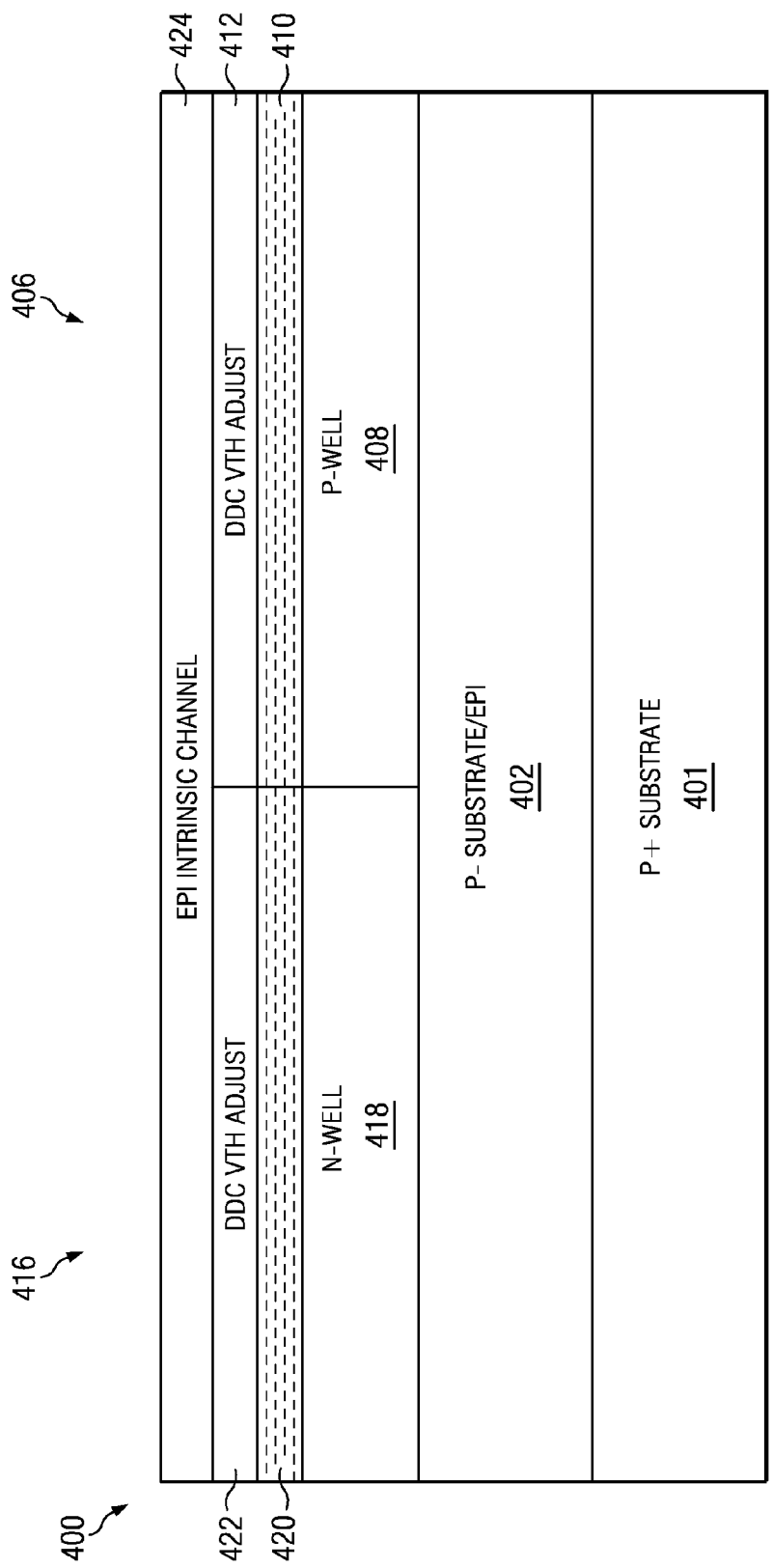

In FIG. 4I, photoresist layer 425 is removed and an epitaxial layer 424 of intrinsic silicon is grown across PFET 416 and PFET 406 on top of threshold voltage control layers 412 and 422. Epitaxial layer 424 becomes the substantially undoped channel for each of PFET 416 and NFET 406. Isolation and further processing may be performed as shown and described above with respect to FIGS. 3F to 3K.

Figure 5A:
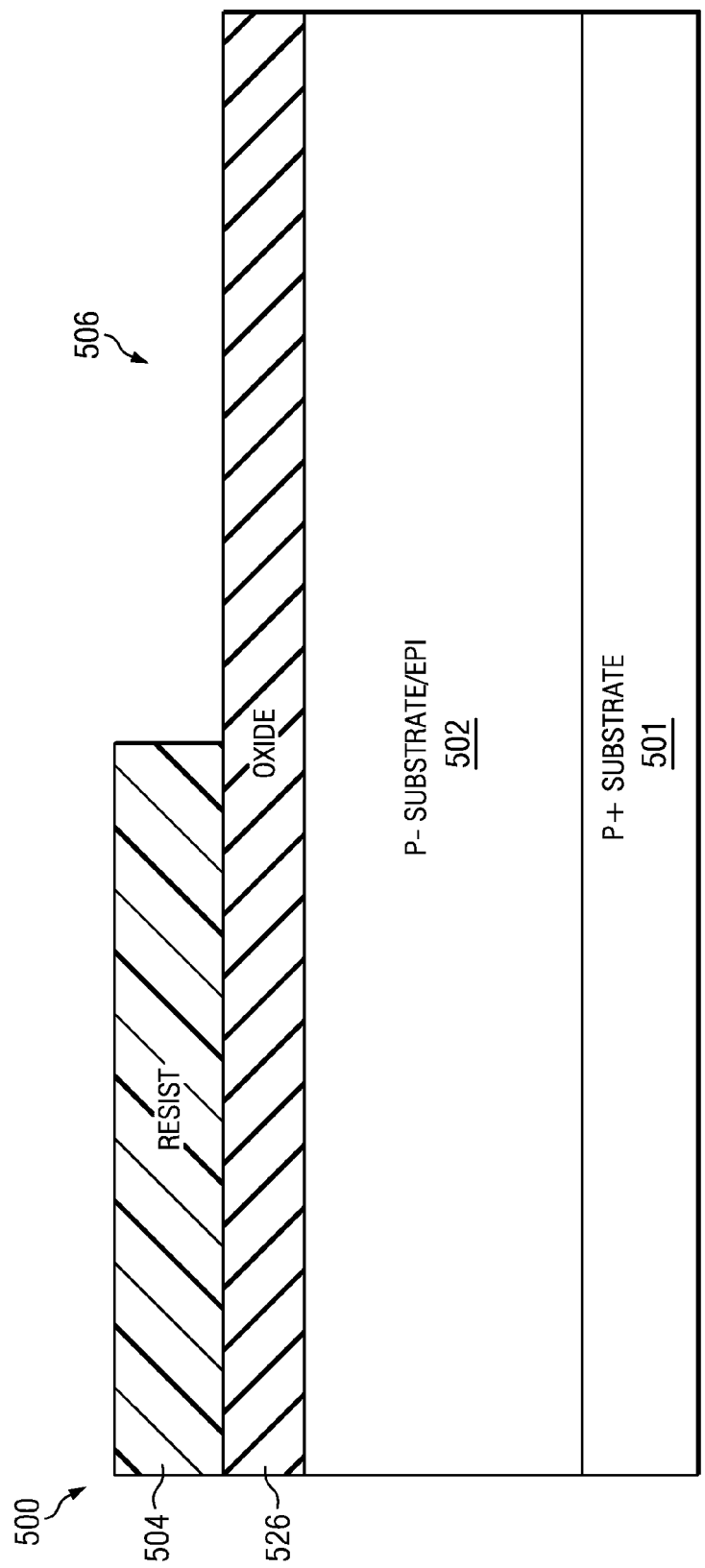
FIGS. 5A to 5F illustrate a fabrication process for a semiconductor structure with a stack using a multiple selective epitaxial layer and shallow trench isolation last approach.
Figure 5B:
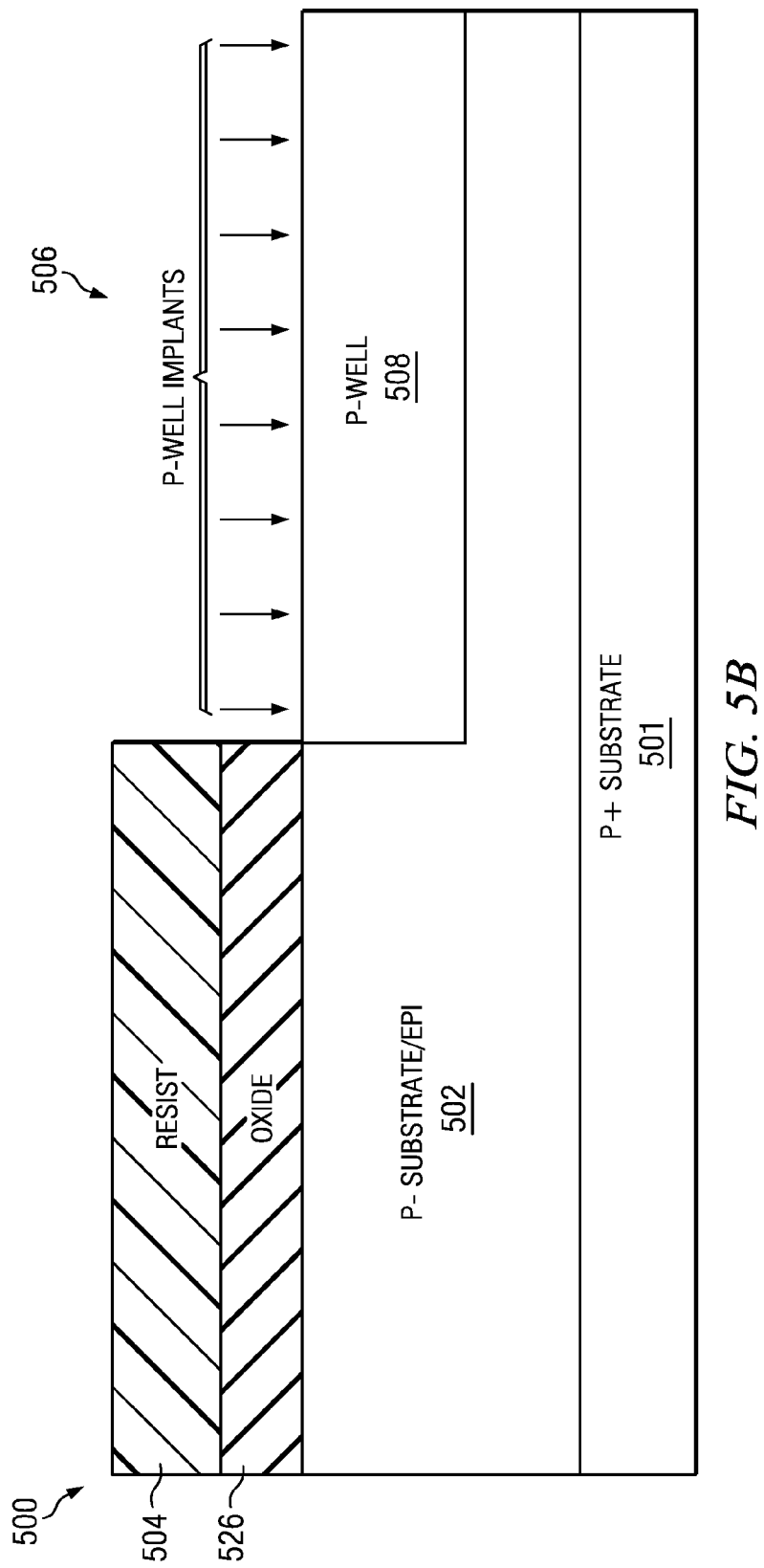

FIGS. 5A to 5F show an embodiment of a multiple selective epitaxial layer process compatible with a shallow trench isolation last approach for forming a structure 500 having transistor elements with the three layer stack to optimize overall transistor performance. The process begins in FIG. 5A with a P+ substrate 501 and a P− silicon epitaxy layer 502 formed thereon and used for structure 500. Initial patterning is performed by depositing a pad oxide or nitride layer 526 on structure 500 and forming a photoresist mask 504 and etching away desired portions of the photoresist mask 504 and pad dielectric layer 526 to expose an area 506 for a first transistor element, in this instance an NFET. In FIG. 5B, ion implantation is performed to create a p-well region 508.

Figure 5C:
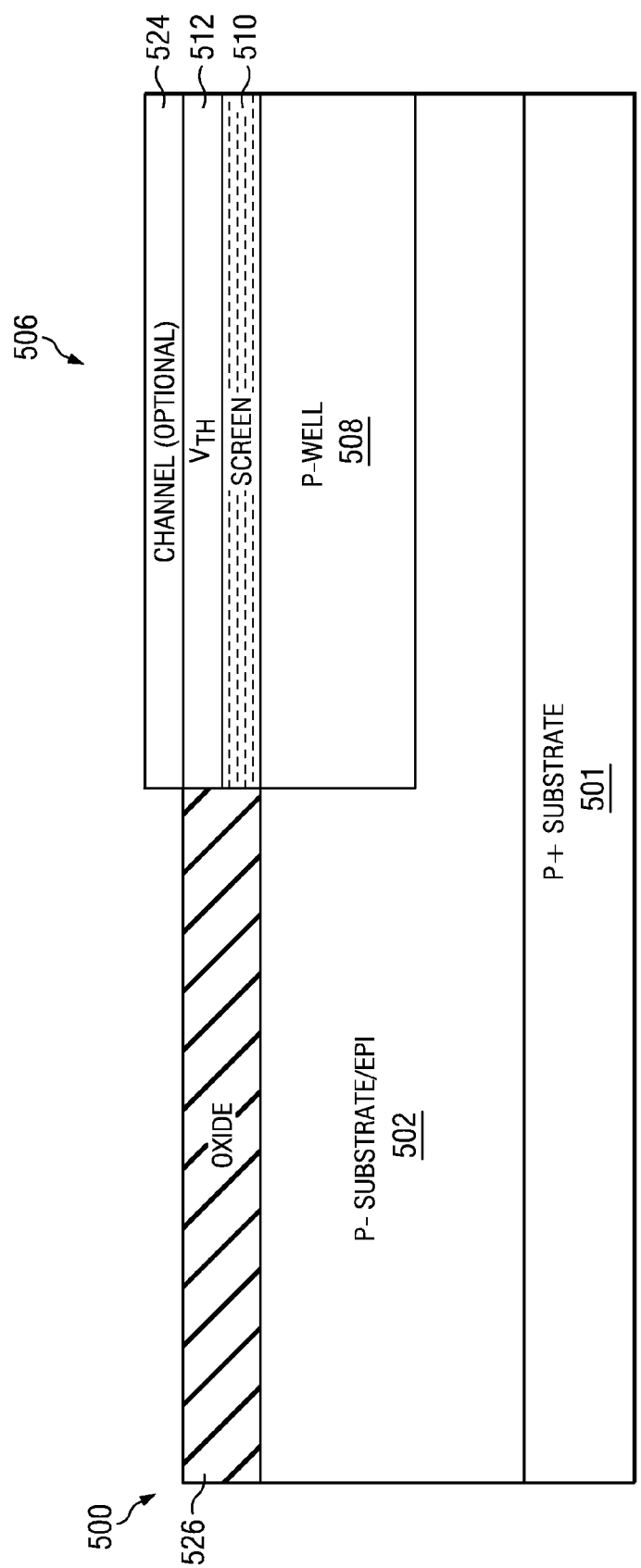

In FIG. 5C, formation of a screening layer 510 and a threshold voltage control layer 512 may be performed in different ways as discussed above. Screening layer 510 may be formed through ion implantation into p-well region 508, through in-situ deposition of doped material, or through intrinsic epitaxial growth followed by ion implantation. Epitaxial layers can be grown as a selective layer, only growing silicon over exposed silicon, or can be grown as a blanket layer (growing epitaxy on exposed epitaxy, and poly on the exposed dielectric layer). In the case of blanket deposition, the poly grown over the dielectric would need to be removed before patterning to expose the other MOS transistor window. Threshold voltage control layer 512 may be formed through in-situ deposition of doped material or through intrinsic silicon epitaxial growth followed by ion implantation. Channel layer 524 may be formed through intrinsic silicon epitaxial growth. Optionally, channel layer 524 may be formed as to be shown later as a blanket intrinsic silicon epitaxial growth.

Figure 5D:
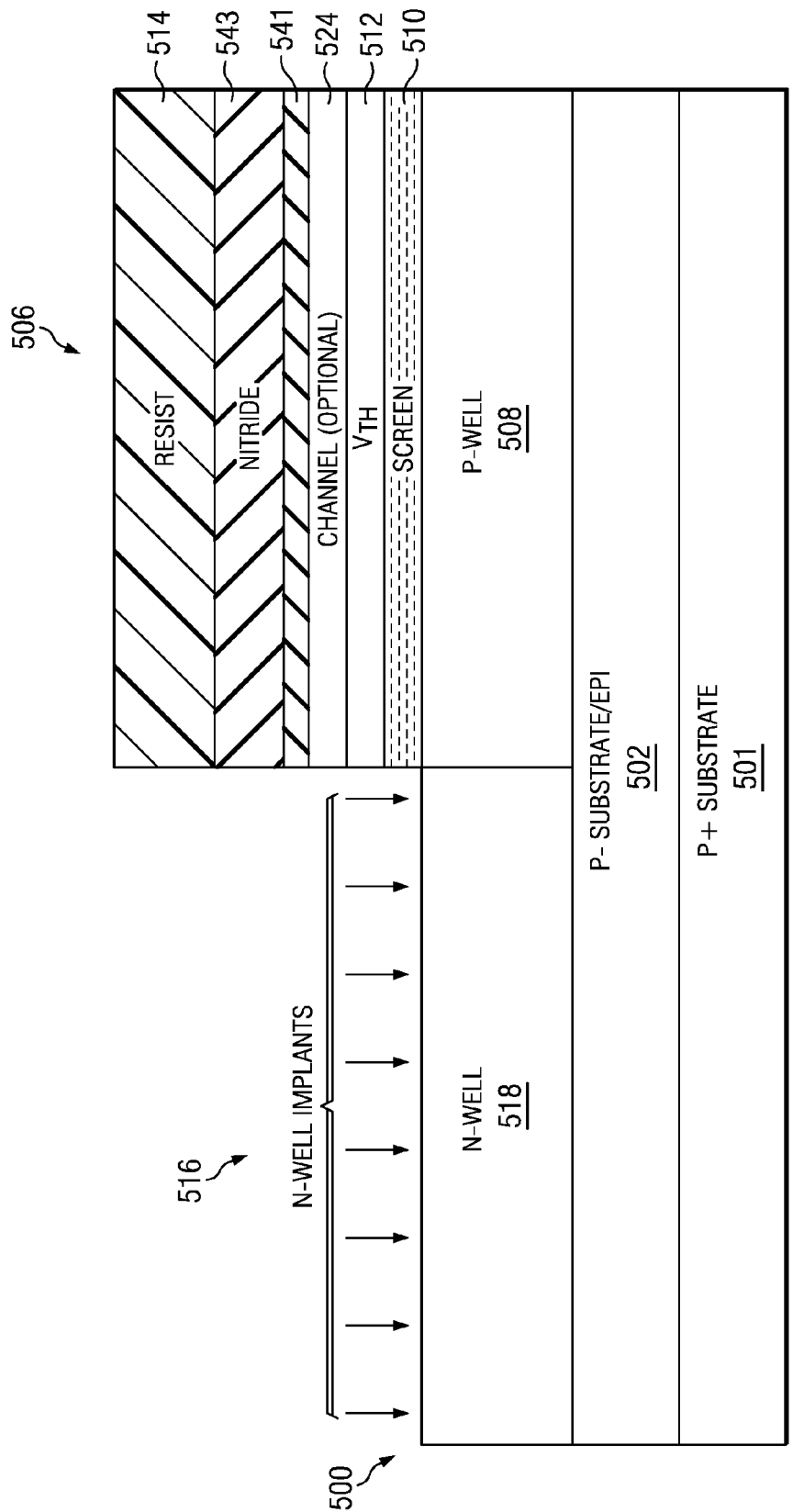

In FIG. 5D, a thin oxide layer 541 is deposited over channel layer 524. A nitride hardmask 543 is then deposited on thin oxide layer 541. A new photoresist layer 514 is patterned to expose an area 516 for a second transistor element, in this instance a PMOS transistor. Nitride hardmask 543, thin oxide layer 541, and pad oxide layer 526 are etched away at PFET element 516 and ion implantation is performed to create a n-well region 518.

Figure 5E:
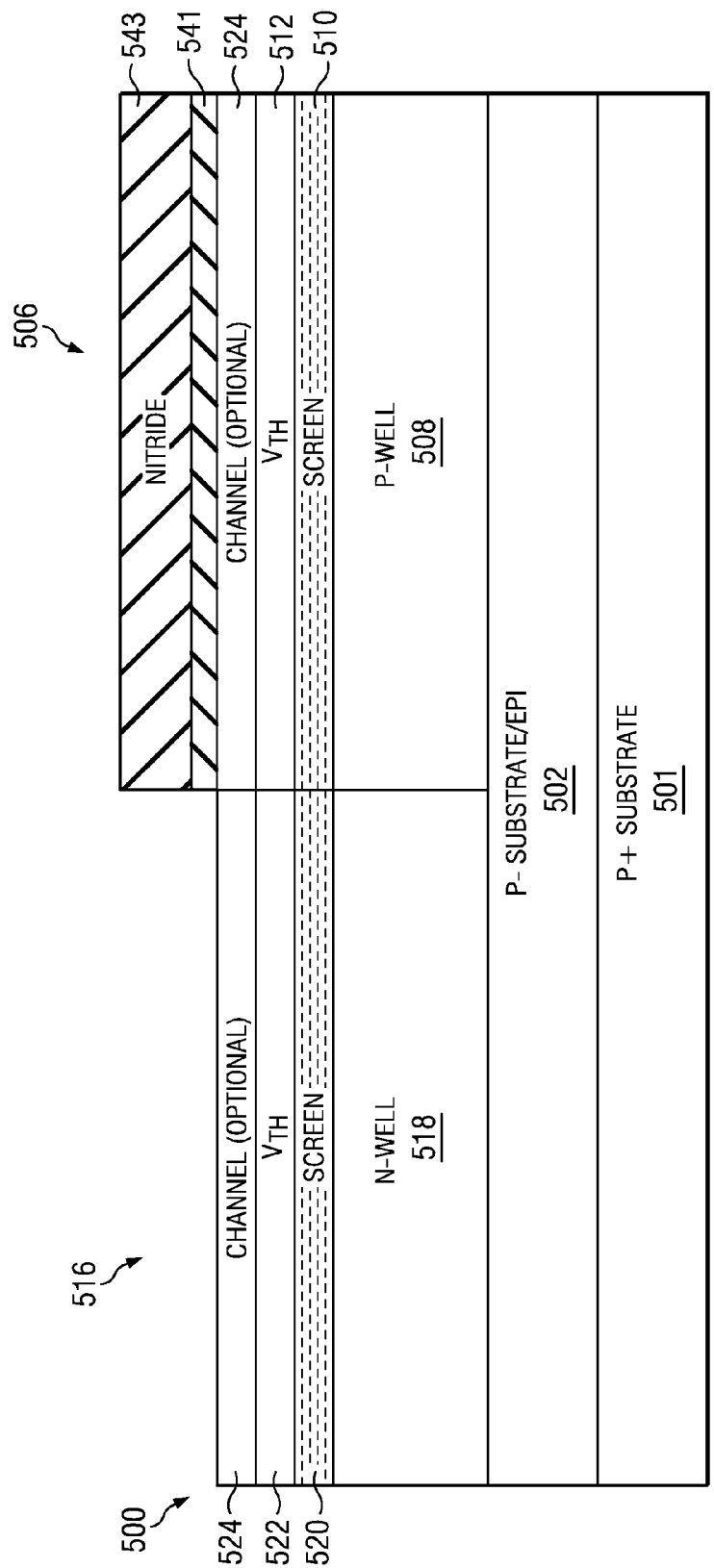

In FIG. 5E, formation of a screening layer 520 and a threshold voltage control layer 522 may be performed in different ways as discussed above. Screening layer 520 may be formed through ion implantation into n-well region 518, through in-situ deposition of doped material, or through intrinsic silicon epitaxial growth followed by ion implantation. Threshold voltage control layer 522 may be formed through in-situ deposition of doped material or through intrinsic silicon epitaxial growth followed by ion implantation. Channel layer 524 may be formed through intrinsic silicon epitaxial growth. Optionally, channel layer 524 may be formed, as to be shown later, as a blanket intrinsic silicon epitaxial growth.

Figure 5F:
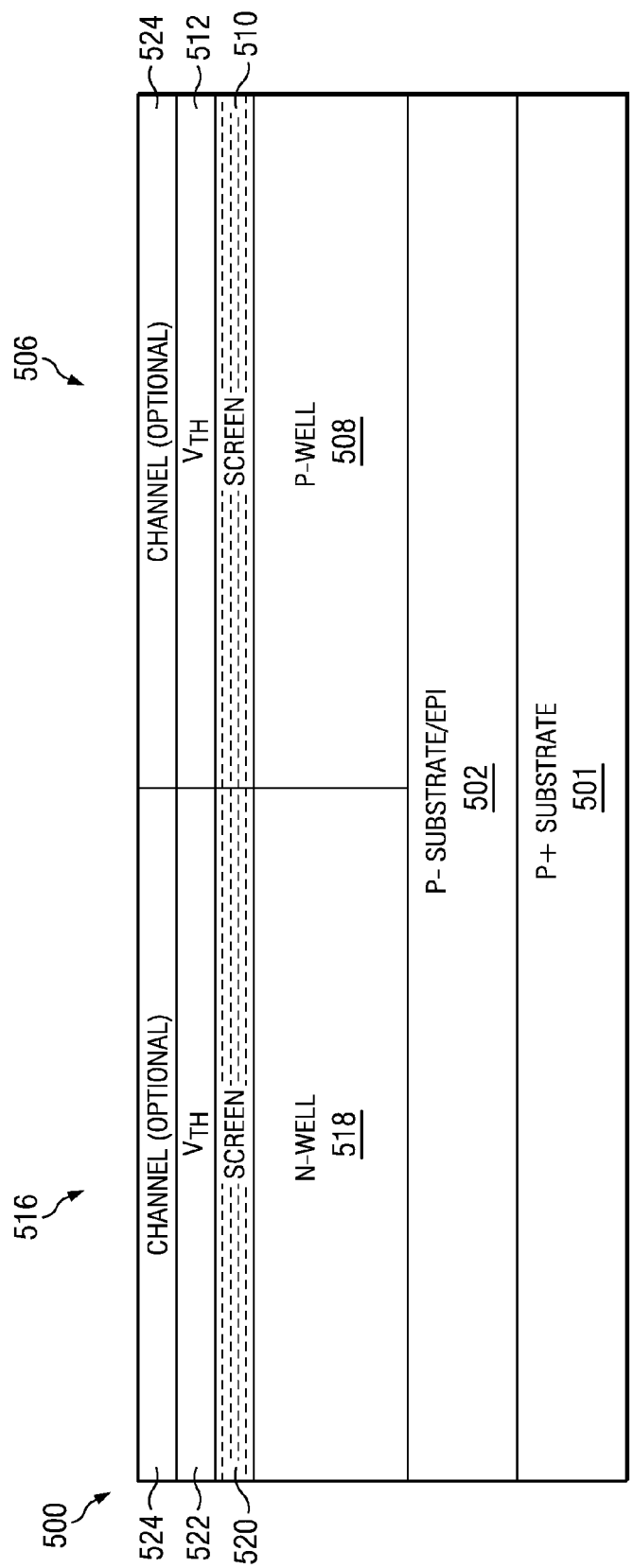

In FIG. 5F, nitride hardmask 543 and thin oxide layer 541 are etched away. At this point, if channel layers 524 for PFET element 516 and NFET element 506 have not been formed, a blanket channel layer 524 may be formed on structure 500 through intrinsic silicon epitaxial growth. Isolation and further processing may be performed as shown and described above with respect to FIGS. 3F to 3K. If desired, the selective epitaxy formation process shown in FIGS. 5A-5F could also be performed after completing conventional STI isolation.

By precisely controlling the doping structure of the transistor channel, the speed/performance can be maintained while significant power consumption savings can be realized. Since reduced power consumption is one goal of the DDC transistor structure, attention to leakage current sources and control techniques for the DDC structure are paramount to a successful implementation. A way to reduce leakage is to dope the DDC transistor structure in such a manner as to control the ultimate dopant concentration profiles along the substrate and channel.

To reduce unwanted diffusion of boron and enhance profile abruptness, NMOS process flows can further include carbon near the screen implant. For ideal boron protection, the carbon should be substitutional rather than interstitial in the lattice. To improve carbon substitutionality, a preamorphization implant (PAI) followed by a solid phase epitaxy anneal is generally used. Typically, the PAI is performed prior to the boron implant(s), but the sequence may be switched. PAI is typically performed prior to the carbon implant(s), but that sequence may also be switched. Several preamorphization species exist that may be adequate for the job, such as Xe, Si, and carborane to name a few. Germanium is preferred because it is already commonly utilized to improve implant species abruptness near the gate and channel for contact implants such as LDD implants and source/drain implants. Unfortunately, both carbon and the PAI can degrade device leakage performance. Carbon can protect the boron screen implant from excessive diffusion during thermal anneals and oxidations, but carbon itself tends to diffuse. If carbon diffuses up near the gate dielectric layer, transistor performance may degrade due to carbon infusion into the gate dielectric. Effects include reduced channel mobility and junction leakage issues.

The dose for the PAI species, usually germanium, should be high enough to amorphize the well to the desired depth. A low dose ($<1e14/cm^2$) will usually result in reduced extent of amorphization, which can result in poor recrystallization during a subsequent recrystallization anneals like solid phase epitaxy (SPE). However, a high dose ($>1e15/cm^2$) can result in an excessive end-of-range (EOR) damage accumulation region. A secondary effect of a PAI dose is its impact on the magnitude and depth of the EOR damage accumulation region. The primary depth control is the PAI energy. However, the amorphization depth and end of range damage accumulation region will become deeper or shallower with dose at a specific energy. Improper PAI energy or dose selection can result in poor placement of the EOR damage accumulation region relative to other device features such as LDD or source/drain regions. Essentially, the EOR damage accumulation region placement should occur in a location relative to LDD and source/drain regions as well as STI depth by modeling for minimum harm to the transistor by way of EOR as a leakage path while maintaining an effective PAI region to receive carbon to protect the boron from unwanted diffusion migration. Note that while the PAI processes described herein are presented in the context of a boron screen, the processes apply to any regions having doped areas and where it is desirable to maintain a defined dopant concentration profile, for instance threshold voltage control layer, source/drain and LDD implants.

Moving the carbon into substitutional lattice sites before a high temperature processing step can help to avoid carbon diffusion while still maintaining good protection against boron diffusion. Under certain annealing and dose conditions, the carbon can cluster, which also prevents carbon diffusion. However, the ability of the carbon to protect the boron from transient enhanced diffusion (TED) and, for that matter, oxygen enhanced diffusion (OED) is diminished for clustered carbon. Also, the clustered carbon may cause higher leakage current in DDC devices. Silicon interstitials generated during implantation, oxidation, or other process steps can kick-out both B and C from substitutional sites, resulting in further B and C diffusion.

PAI followed by an anneal, typically done using solid phase epitaxy (SPE), work well to get the carbon and boron implants into substitutional sites. However, the PAI dose typically used, which is about 5e14 per $cm^2$, leaves an EOR damage that may not be not fully annealed out by the SPE regrowth. The EOR layer can contribute to device leakage current, so it needs to be carefully located within the device structure by adjusting the PAI dose and energy in order to minimize the creation of current paths from the source and drain. However, the EOR defect density should also be minimized.

The extent of carbon substitutionality and EOR damage recovery both respond differently to various annealing conditions. The type of anneal that gives the highest substitutional percentages of carbon and boron may not give the optimum damage recovery. Generally speaking, shorter time constant anneals with fast temperature ramp rates tend to favor substitutionality, while long anneals at reasonably high temperature tends to favor damage recovery. Both excessive diffusion of implanted species and/or high residual damage from the ion implantation process can contribute to leakage current.

Figure 6:
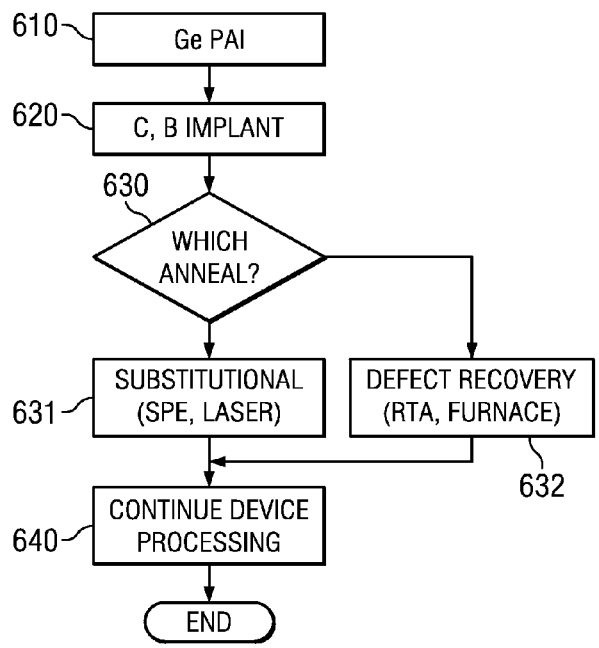
FIG. 6 illustrates an exemplary process flow for forming doped portions of a transistor element.

In an example process flow at FIG. 6, all implant conditions are selected to achieve desired dopant placement and the concentration and thickness of doped regions. The thermal conditions are selected to achieve desired dopant concentration profiles below the undoped channel while minimizing diffusion into undesired areas. The process examples provided here are for forming the implanted channel portions of an NFET, as generally referred to in FIG. 1. The channel formation begins with a pre-formed well and an optional anti-punchthrough region using conventional implant conditions. The subsequent process flows are aimed at forming the screening layer and threshold voltage control layer to electrical specifications in such a manner that, when the epitaxial layer is formed after the implants, there results in a desired film thickness for the substantially undoped epitaxial layer above the threshold voltage control layer. The process begins with a Ge PAI implant 610 into substrate, having the pre-formed well and optional anti-punchthrough region, which generally may be at an energy between 25 and 70 keV or a lesser energy such as 2 to 10 keV, depending on the area targeted (for DDC implanted regions, or to set up for LDD and/or source/drain implants, or elsewhere), for a dose of between 5e13 and 5e15 atoms per $cm^2$. Then, a C anti-diffusion implant 620 using conditions which may include an energy of between 1 and 12 keV or a lesser energy such as 0.5 to 1 keV, depending on the area targeted (for DDC implanted regions, or to set up for LDD and/or source/drain implants, or elsewhere), for a dose of between 5e13 and 5e15 atoms per $cm^2$ is performed. Step 620 further includes a B implant, which may be done either before or after the C anti-diffusion implant. The B implant conditions typically include an energy of between 1 and 12 keV or a lesser energy such as 0.5 to 1 keV, depending on the area targeted (for DDC implanted regions, or to set up for LDD and/or source/drain implants, or elsewhere), at a dose of between 5e12 and 5e15 atoms per $cm^2$. Though the order of the C implant and B implant are provided as the C implant being performed first, the order can be switched so that the B implant is performed prior to the C implant. Then, a decision 630 is made as to whether to use one of recrystallization SPE anneal 631 that may be performed at a temperature ranging between 600 and 800 degrees C. for the duration needed for recrystallization, which may be between 60 and 300 seconds, and a high-temperature spike anneal 632 that may be performed using a peak temperature ranging between 800 and 1500 degrees C. favoring defect repair and activation. Then the device continues in its fabrication processing 640. The decision 630 is based upon a judgment as to whether there is a greater need for recrystallization or a greater need for activation of dopant(s). It is noted that recrystallization anneal can be performed using SPE but other methods such as spike anneal, laser anneal, or any step that includes a moderate to high temperature (500-1250 C) effective to recrystallize the lattice can be used. General reference to SPE includes alternative methods of recrystallization anneal. It is noted that defect repair and activation anneal can be performed using rapid thermal anneal (RTA), furnace, or other methods favoring a spike to a sufficiently high temperature to activate the implanted dopants and repair damage to the lattice. General reference to spike anneal or RTA includes alternative methods of activation and damage repair anneal.

Figure 7:
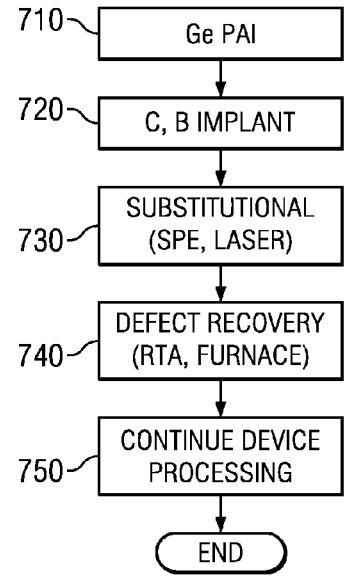
FIG. 7 illustrates an exemplary alternative process flow for forming doped portions of a transistor element.

An alternative flow as provided in FIG. 7 is presented and, for purposes of describing this and subsequent alternative flows, similar implant and thermal conditions as described above can be used. The process at FIG. 7 includes a Ge PAI implant 710 into the substrate having a pre-formed well and optional anti-punchthrough region. Then, a C anti-diffusion implant 720 together with a B implant is performed. Though the order of the C implant and B implant are provided as the C implant being performed first, the order can be switched so that the B implant is performed prior to the C implant. Likewise, the order of B and/or C could be switched with the PAI anneal if desired. Preferably, the next step 730 is to recrystallize the otherwise amorphized lattice. It is thought that activation of most of the carbon and boron occurs as a result of the SPE 730 step. Then, a spike anneal step 740 is performed to repair remnant damage and to further activate the boron. The device then continues through the fabrication process 750.

Figure 8:
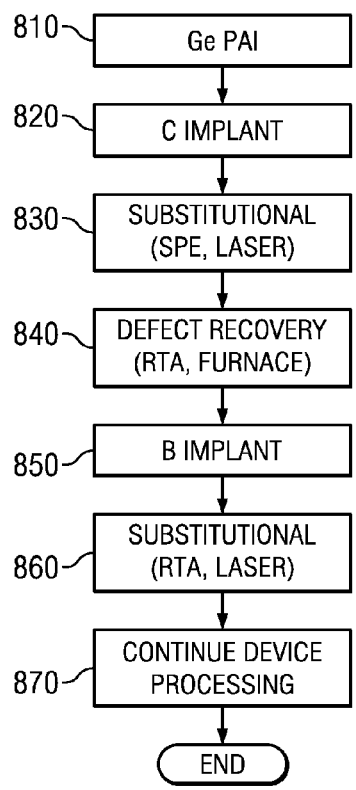
FIG. 8 illustrates an exemplary alternative process flow for forming doped portions of a transistor element.

An alternative flow is presented at FIG. 8. The process begins with a Ge PAI implant 810 into the substrate having the pre-formed well and optional anti-punchthrough region. Then, a C implant 820 follows for anti-migration of a to-be-implanted dopant. Recrystallization preferably using SPE 830 is performed to recrystallize the lattice and substitutionalize the carbon, and a separate spike anneal which may be rapid thermal anneal (RTA) 840 is performed to further repair damage. B implant 850 is then performed. Then, another anneal 860 is performed, to substitutionalize and thereby activate the B. The device then continues its fabrication processing 870.

Figure 9:
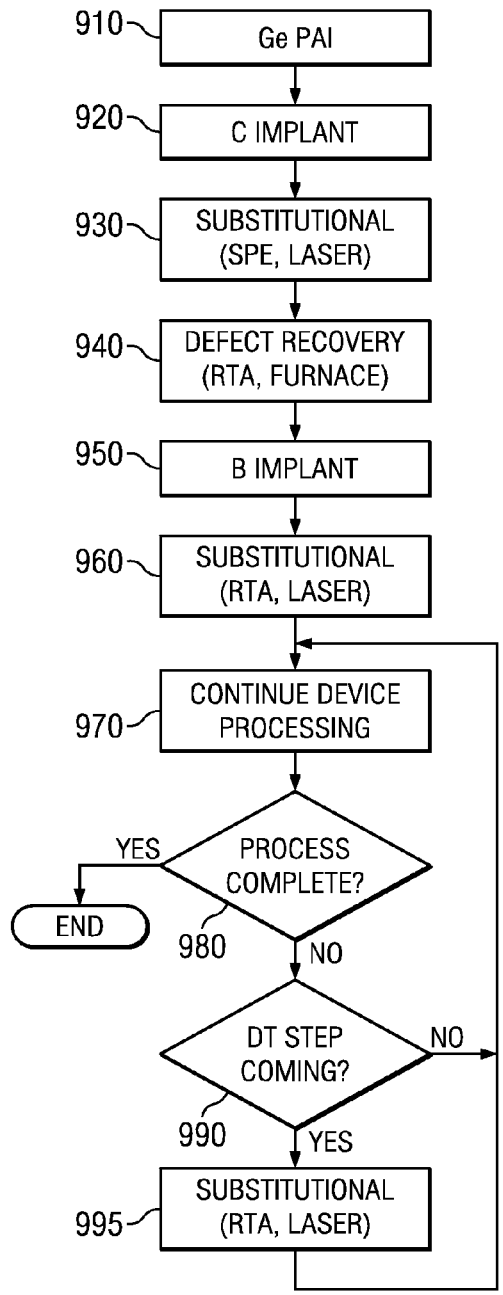
FIG. 9 illustrates an exemplary alternative process flow for forming doped portions of a transistor element.

A further alternative flow is presented at FIG. 9. The process begins with a Ge PAI implant 910 into the substrate having the pre-formed well and optional anti-punchthrough region. Then, a C implant 920 follows for anti-migration of dopants. SPE 930 is performed to recrystallize the lattice and to substitutionalize the C, and a separate spike anneal 940 is performed to further repair damage. B implant 950 is performed and another anneal 960 is performed to drive substitution and activate the B. The device then continues its fabrication processing 970. A decision point 980 is made as to whether the process can complete or whether a further Differential Thermal (DT), in other words, a high-temperature step 990 needs to be done. An example of a DT step is densification for shallow-trench isolation, which typically occurs at very high temperatures such as 900 to 1250 degrees C. As described above, shallow-trench isolation preferably occurs after the formation of the DDC transistor doped areas. If DT step 990 is not to be done, the device continues its fabrication process 970 until completed. If DT step 990 needs to be done, then a further anneal, preferably spike anneal 995 is performed prior to the DT process as a way to guaranty the best possible species diffusion resistance at each high DT step in the transistor building process. The purpose of each pre-DT anneal is to repair existing damage to reduce interstitial and vacancy concentration, as well as to move dopants back into substitutional positions in the case they have been deactivated by previous processing steps. The step of performing the substitutional anneal 995 can be repeated as many times as needed to ensure against movement of the boron during subsequent DT. After the DT steps are completed, the device continues its fabrication process 970 until completed.

Figure 10:
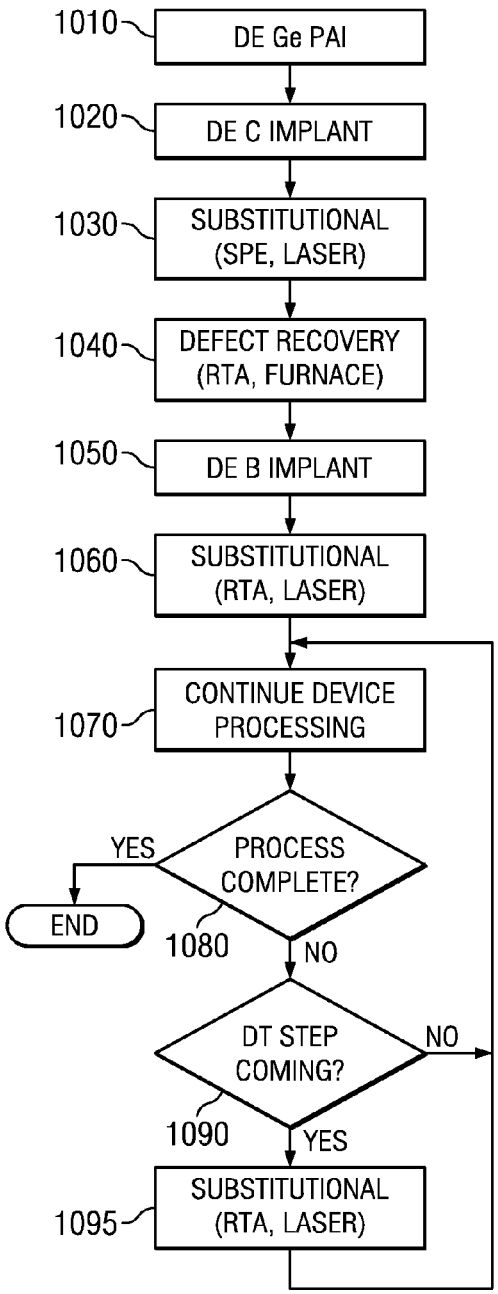
FIG. 10 illustrates an exemplary alternative process flow for forming doped portions of a transistor element.

In still another example at FIG. 10, the implants of the above examples are replaced with Damage Engineering (DE) style implants into any of the previously mentioned flow examples. A DE implant is an implant done using a specially configured implanter that allows for the substrate to be held at a controlled and lowered substrate temperature, which may lower the amount of damage accumulated in the PAI EOR region that could reduce final device leakage current. The process begins with a DE Ge PAI 1010. Then, a DE C implant 1020 is performed for anti-diffusion carbon species. A recrystallization SPE 1030 is performed, as well as a spike anneal RTA 1040 defect recovery step. A DE B implant 1050 is performed, followed by spike anneal RTA 1060 for further defect repair. The device continues processing 1070 and may continue 1080 to completion without additional anneals or the process may further require a DT step 1090. If a DT step 1090 is performed, then preferably it follows that a spike anneal RTA 1095 is performed prior to one or more of the DT steps whereupon, after that, the device continues its fabrication process 1080 until completed.

Figure 11:
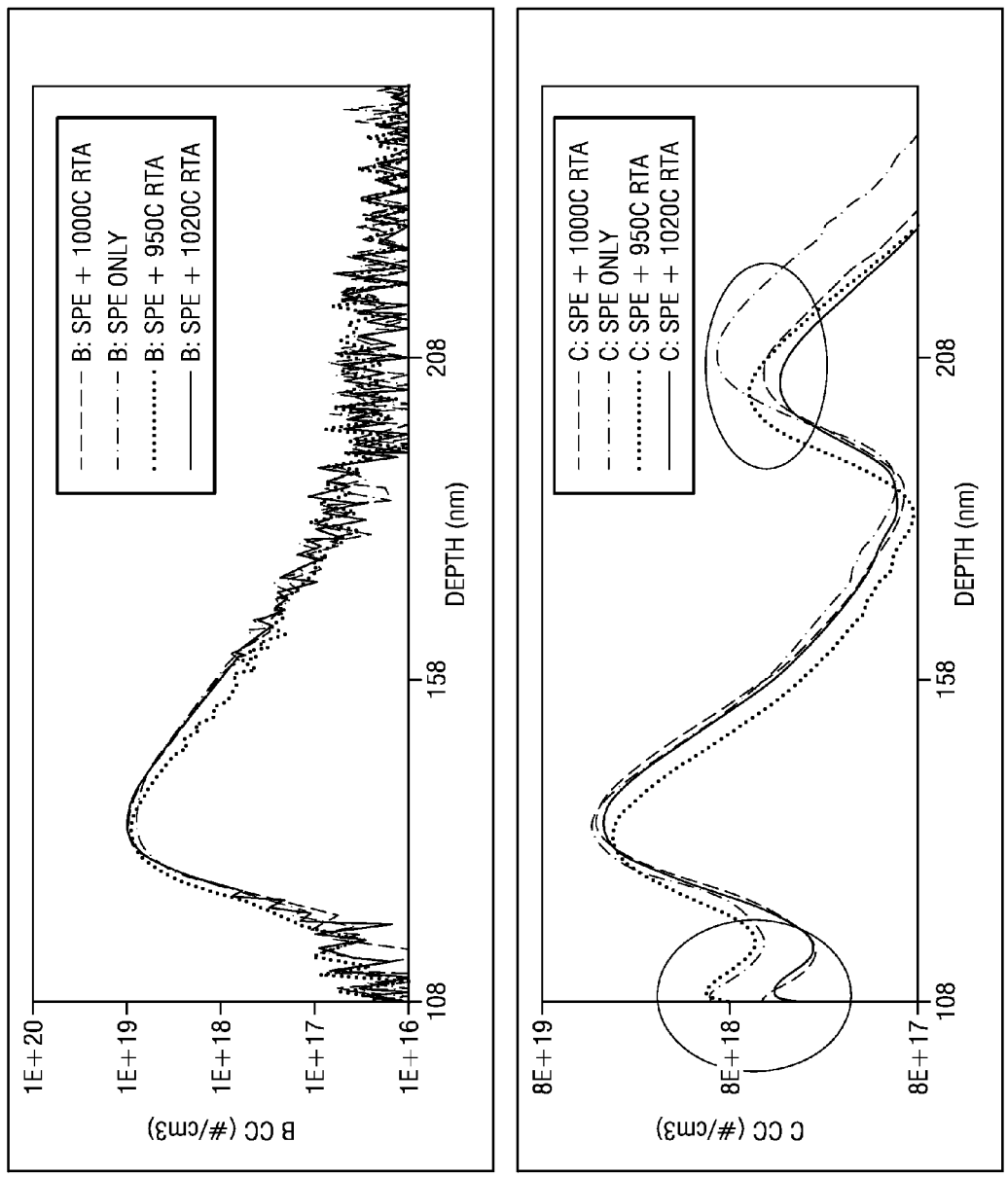
FIG. 11 illustrates boron and carbon diffusion under different annealing conditions.

In FIG. 11, the graph titled "Examples of Different Anneals 1" gives an example of how various types of anneals can impact the profile and defect concentration level in a DDC type of structure. In the example provided, the secondary carbon peak gives some evidence of how the EOR implant damage responds to the overall DT. The sample without the additional spike anneal RTA (lowest overall DT) has the highest accumulated carbon, with a decreasing carbon secondary peak as the DT is increased from 950° C. to 1000° C. to 1020° C. On the same graph, the circle on the left hand side highlights the carbon accumulated into the gate dielectric of the device which gives a good example of overall diffusion performance. In this example, the higher DT process flow also had the lowest accumulation in the gate oxide.

Figure 12:
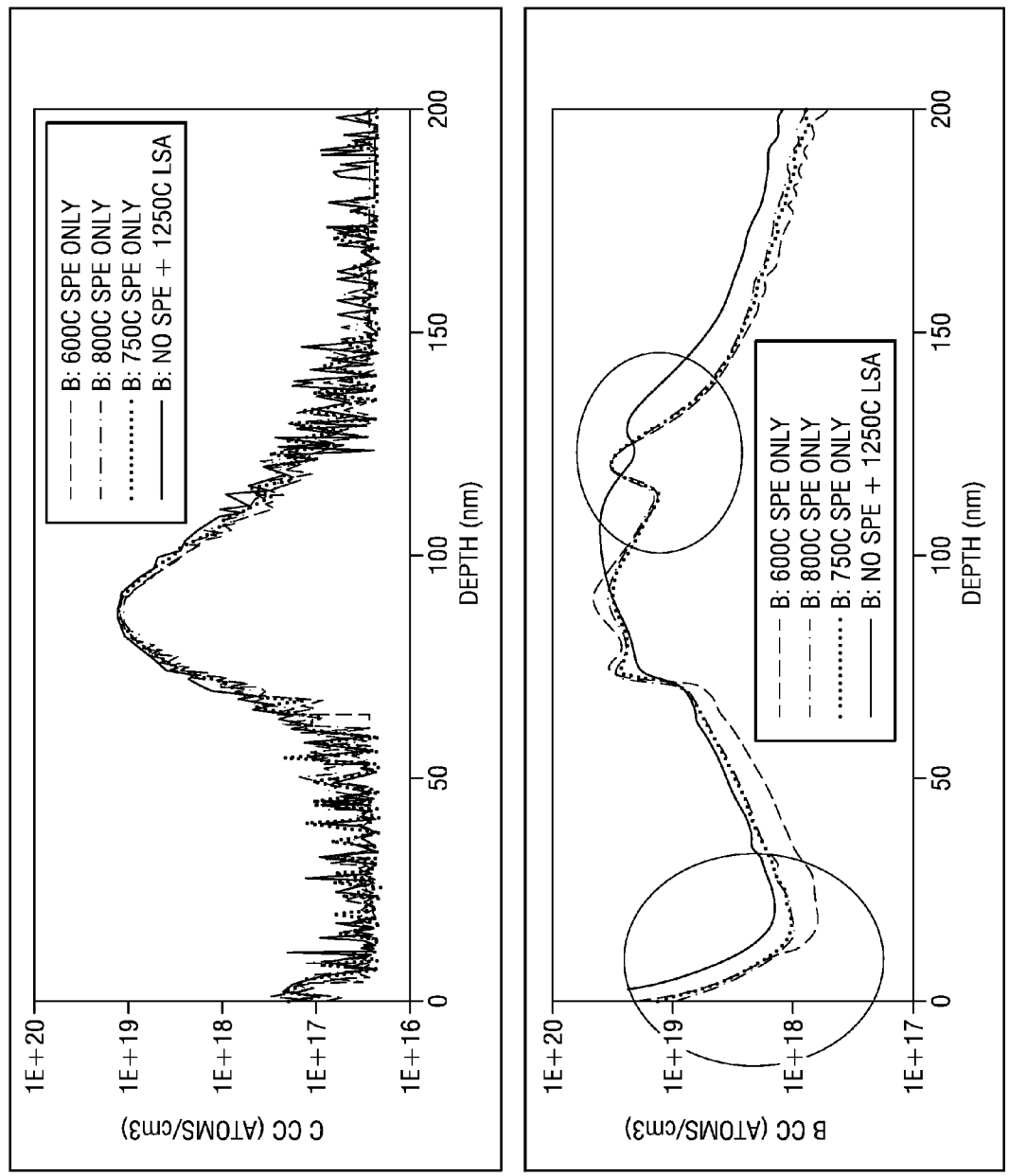
FIG. 12 illustrates further boron and carbon diffusion under different annealing conditions.

In the next example graph at FIG. 12 titled "Examples of Different Anneals 2", there is shown a different response to the anneal conditions. In this graph, the profile with the lowest DT (laser anneal only) shows the highest carbon diffusion (seen by the accumulated carbon in the gate dielectric or yellow highlighted part of the graph as well as from the overall profile spreading), while showing the smallest EOR region decoration. This suggests that this condition relieved the EOR defect. In the examples provided, different SPE temperature conditions all show comparable carbon accumulation in EOR area. However, they have different main carbon peak concentration and accumulation in the silicon channel between the peak and the gate dielectric. In effect, DDC structures benefit from different anneal conditions for substitutionality (and profile control). In a DDC structure, separate anneals could be used to first target one parameter (either substitutionality or defect reduction) and then a different anneal could be done to target the other parameter. DDC structures also benefit from a substitutionality anneal before any significant DT thermal step in the transistor flow that follows the screen layer formation. In addition, substitutionality and spike anneal combinations could be utilized for any traditional transistor structures to improve dopant profile control, for instance tip, source/drain, or halo implant profile protection. DE or cold implants can reduce leakage current in DDC structures by reducing the EOR damage accumulation intensity or by reducing the quantity of silicon interstitials generated during the implantation process in samples that utilize a PAI type implant. It will be noted that controlling the carbon accumulation at the gate dielectric and top of the silicon channel is important for gate leakage performance and mobility in DDC transistors, while controlling the implant EOR damage intensity and location is important for junction leakage performance in DDC transistors.

In traditional transistor designs, the main junction leakage source can be associated with the region of highest electric field in the device where the high concentration LDD or source/drain implants come in proximity to a high concentration opposite conductivity dose such as the halo implant. DDC transistor design methods, in contrast, compensate for high electrical field issues due to the relatively high concentration, for instance 3e18 to 5e19/cm$^3$, boron screen layer in proximity with LDD or source/drain implants; contamination from the transient enhanced diffusion (TED) control species (e.g. C) diffusing into the gate dielectric or STI, forming defects in depletion regions adjacent to LDD or source/drain implants, degrading mobility in the device channel; general damage and incomplete recrystallization from the PAI implant (e.g. Ge), silicon interstitial release from the EOR region during device processing that results in poor profile control, as well as carrier generation/recombination occurring within the PAI EOR damage accumulation region during device operation.

Using a different implant energy for the PAI may require a slightly different PAI dose for full amorphization and optimum B and C profile control. Generally, lower PAI energy will result in less carbon diffusion into the intrinsic channel, a shallower EOR damage band location, higher accumulated carbon and boron in the EOR region (as a result of the proximity to the screen implants), and a narrower PAI species profile shape relative to depth. It may also allow a lower overall PAI dose to be utilized to fully amorphize the screen implants, and it may allow less or require more carbon to protect the boron profile from TED and OED. Experiments have indicated that superior transistor performance results from use of higher Ge PAI energy (>30 keV) which puts the EOR damage band further away from the screen and high electric field areas within the device, and results in lower levels of accumulated C and B species within the EOR defect band.

There is an opposed relationship between protecting the boron profile and minimizing carbon contamination of surrounding layers. By performing a very low energy and low dose carbon implant (for instance 0.5 keV, $5e13/cm^2$), the carbon layer offers good boron profile leading edge abruptness control and minimal carbon diffusion into the intrinsic channel and PAI EOR layer. In certain embodiments, boron peak concentration can fall compared to a deeper and larger carbon dose. As a further improvement, a shallow carbon profile can be developed to provide boron leading edge profile control and minimum carbon contamination in the silicon channel, while a deep carbon implant is utilized to protect the trailing (substrate) profile edge and also protects the boron peak concentration.

As will be appreciated, improper PAI energy or dose selection can result in poor placement of the EOR damage accumulation region relative to other device features such as LDD or source/drain contacts. The TED control species should have a minimum peak concentration to allow adequate protection of the boron profile (for C, this is about $3e14/cm^2$). Excessive dose may result in clustering or increased "control species" diffusion and increased contamination in nearby oxides, interface layers, and depletion regions. The minimum dose for germanium PAI is typically on the order of $2e14$-$5e14/cm^2$ for a 30 keV implant energy. Boron diffusion control favors high carbon concentrations. However, preventing carbon diffusion into channel and EOR accumulation regions favors low carbon concentrations. Shallow carbon can significantly reduce carbon contamination within the intrinsic channel as well as the PAI EOR region and improve the boron screening layer abruptness.

The energy and dose for the screen and Vt dopants may be similar to conventional ion implantation processes, or may be lower in energy or dose than conventional implantation processes. For instance, boron, arsenic, and antimony doping for the screen and threshold voltage control layers in DDC type structures is typically about $5e12/cm^2$ to $5e13/cm^2$. Additionally, a shallow C implant corresponding to the screen implant may use a targeted implant energy that can be as low as 0.5 keV or lower.

Figure 13:
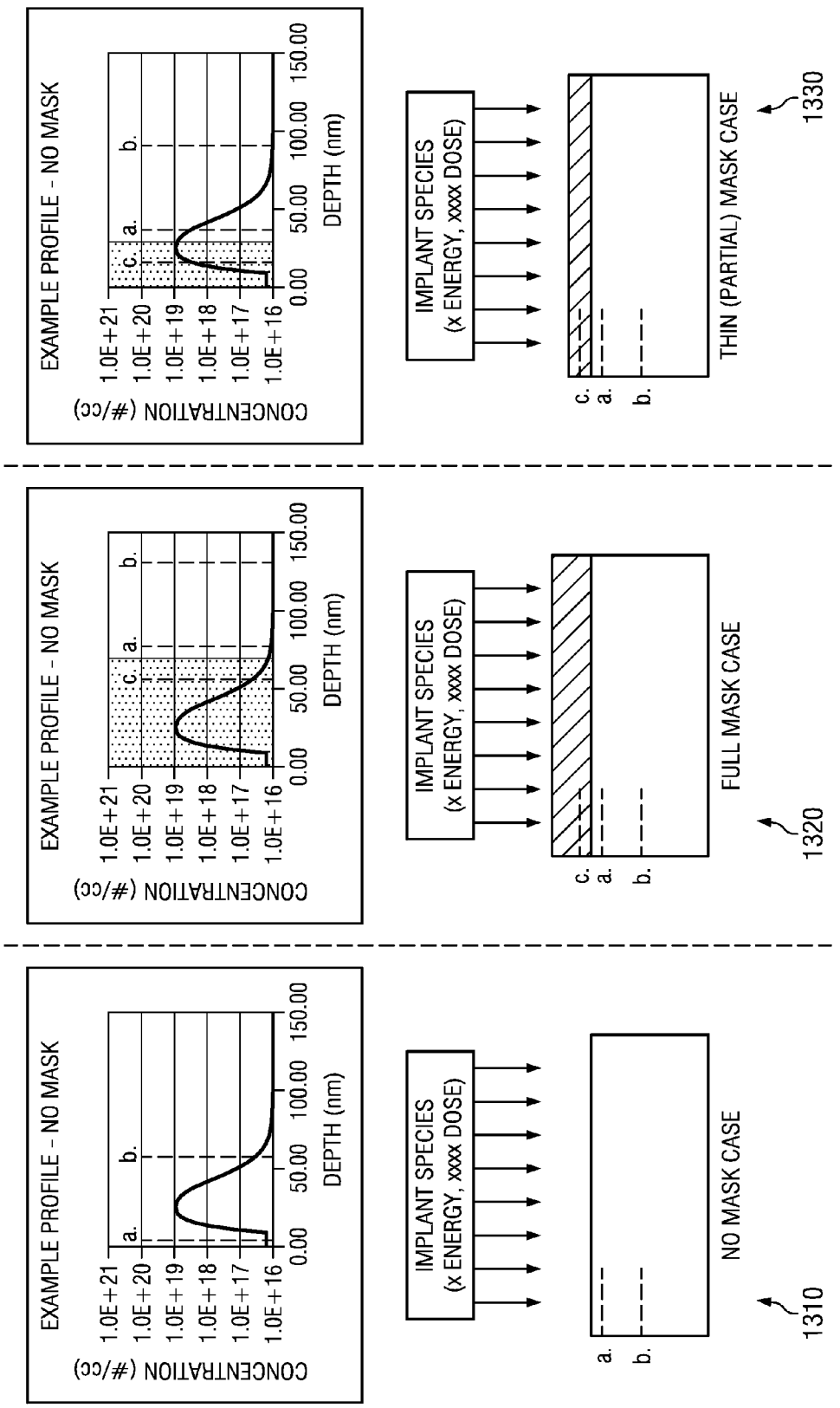
FIG. 13 illustrates a maskless, partial, and full mask approach for controlling implantation.

At FIG. 13, a method for performing shallow implant is illustrated. At 1310, there is shown in cross-sectional view a substrate onto which direct ion implantation is performed. The resultant dopant profile shows a peak concentration naturally occurring at approximately $1e19/cm^3$. If an effective reduced energy and dose are desired, a mask 1320 can be used to function as a partial barrier layer that absorbs a portion of the implant, thereby only allowing a small controlled portion of the implant (or diffusion source) to become incorporated in the wafer area of interest. This makes the implant more shallow compared to an implant without a barrier and would make the implanted dose reduced by having the barrier layer absorb a portion of the implanted dose. An example of such a partial barrier is a patterned photoresist or oxide or nitride hard mask that would ordinarily block 100% of the incoming implant dose, and thinning it to a pre-selected level so that some of the implant dose will be captured by the mask layer while some of the dose still makes it through the barrier layer to achieve the desired implant profile. A partial thickness mask 1330 can be used to further adjust the depth of the impurity species. The thicker the masking layer, the shallower the impurity would penetrate into the target window. The thinner the masking layer, the deeper the impurity would penetrate (up to full depth when no masking layer was utilized). Common 100% implant barrier layers that are used in the industry include photoresist and dielectrics such as oxide, nitride, aluminum nitride, etc. Any other material common to the semiconductor industry could potentially be used as well, such as sacrificial silicon layers (that will later be stripped off the wafer surface), metals, or any other material that is common to building transistors. All of these same materials could be used as a partial mask simply by making the mask material thinner to the point that the implant begins to penetrate rather than being 100% absorbed.

One of the expected issues with using a partial implant barrier rather than a full 100% blocking barrier would be the available uniformity of potential barrier/masking layers. If the partial blocking mask were not uniform, more implant dose would transmit through a thinner portion of the masking layer, while less dose would transmit through a thicker portion of the masking layer. This would not pose any issue when the implant does not need to be exact to achieve the desired device result, but could become an issue in cases where non-uniform implant dose or depth would adversely affect device performance. Because of potential masking layer uniformity limitations, the semiconductor industry may have never previously considered using a partial blocking mask because of the lack of local dose or depth control which would follow masking layer non-uniformity.

Figure 14:
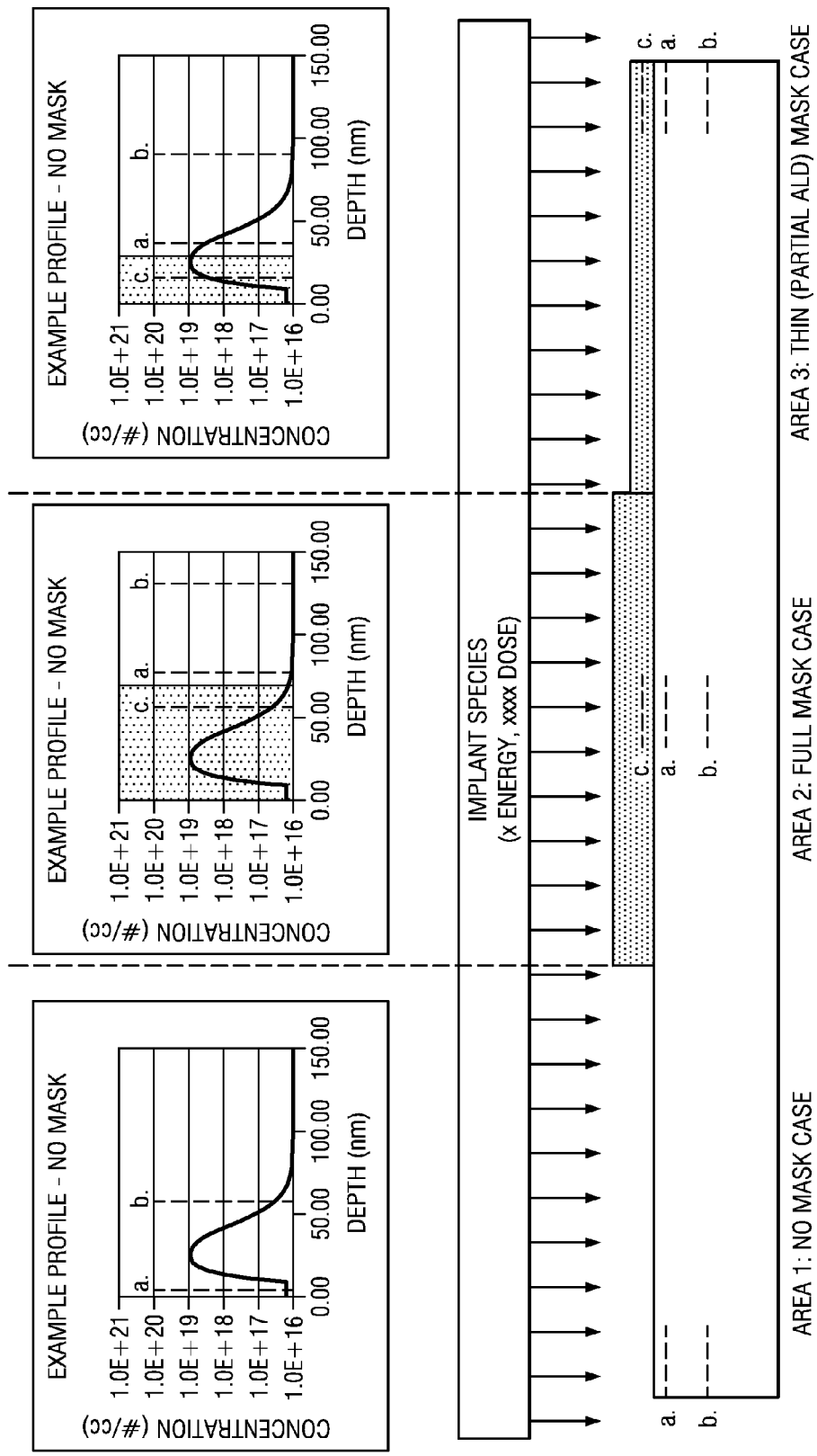
FIG. 14 illustrates an alternative maskless, partial and full mask approach for controlling implantation.

A solution to this potential issue of non-uniformity in partial blocking masks would be to utilize ALD (atomic layer deposition) to generate reliably deposited and uniform partial masking layers. ALD is a process that is designed to grow one monolayer of material at a time, and layer thickness is controlled by successive process cycles which build up the material thickness one atomic layer at a time. Because of the unique growth mechanism, ALD deposited films tend to be extremely uniform, which would make them an ideal candidate for use as a partial masking layer for controlling critical implants. Also, the ALD film has the capability to have a masking thickness that ranges from the very thin (on the order of a few angstroms) to very thick. FIG. 14 shows an example of a combined full mask (to protect areas of the wafer where no implant is desired) with a partial ALD generated mask (to provide dose control in the area of interest), while a third area receives the full dose implant.

With this technique, it is possible to imagine implanting separate areas of the wafer with custom implant doses by tailoring the thickness of the masking layer over the various areas of interest, rather than necessitating changing the implant condition itself for each area of interest. This would give a new control knob to device engineers when designing the integration scheme and process flow for their particular device needs, and may allow a device designer to even design around implant tool limitations to achieve lower dose or energy than a tool was originally designed to deliver. This technique may even allow older generation implanters to be extended to new applications that may now require newer and much more expensive implant tools to perform.

Another way to achieve the same result would be to utilize sacrificial silicon (either single crystal, polysilicon, or amorphous) as a partial mask, then strip, etch, oxidize, or silicide the sacrificial silicon to consume the unwanted implant dose in order to leave behind only the desired implant dose and depth. An area where this technique may be especially useful is for elevated source/drain structures where silicon is deposited over the top of ultra-shallow source/drain implants to be consumed by the metal silicide contact. If a small amount of selective silicon were grown before the source/drain implant, the end result after growing the remainder of the selective silicon for contact would be a shallower source/drain compared to a transistor that did not have the partial selective silicon implant mask.

The same effect could be achieved by not masking the wafer at all, but by implanting full dose and depth everywhere on the substrate. After the implant is completed, the wafer could be masked and selectively etched to remove a specific amount of silicon (and consequently a specific amount of implant dose or depth) from regions of interest. Multiple masking and etching steps could produce multiple final doses and depth from a single implant step.

Also, any combination of the above techniques could be performed, such as some areas of the wafer having full or partial masking layers, some areas having full or partial sacrificial silicon masking layers, some areas being selectively etched or metalized following implant, etc. to produce a variety of implant depths and doses from a single or multiple implant steps.

Following the implantation and thermal anneal steps to fix the screening region and threshold voltage control layer in place, as described above, an epitaxial layer is preferably formed thereabove to provide a substantially undoped channel. For the epitaxial deposition, a pre-epitaxy bake is generally used to remove the native oxide from the silicon surface before beginning the epitaxy deposition step. In conventional epi tools, this pre-bake can occur at approximately 800° C./20 Torr for 30-120 sec in hydrogen ambient gas. Other tools or batch furnaces may use lower temperatures (450° C.-750° C.) at approximately 1 Ton pressure, with fluorine or chlorine chemistry added in an ambient of nitrogen, argon, or hydrogen gas for the native oxide removal step.

Epi deposition replicates the starting silicon surface so, if a textured surface exists before deposition begins, the final epitaxy layer will have similar texture. Preferably, the epitaxy is performed in such a manner so as to achieve a smooth surface. The substrate roughness can be alleviated by selecting epi pre-bake (native oxide removal step) conditions that maximize silicon migration during the epi deposition recipe pre-bake step. The hydrogen bake process parameters that could be optimized for improving surface roughness include process chamber pressure (lower is generally better), temperature (higher is generally better), and hydrogen flow (higher is generally better). Silicon migration can smooth the surface during the epi pre-bake, resulting in smoother substrate surface roughness as well as a smoother epitaxy surface. Another way the roughness could be improved would be to perform a silicon migration bake after the epitaxy deposition step has been completed.

Other "epi pre-bake" techniques that may reduce defect density and surface roughness post-SPE recrystallized PAI silicon include adding Cl or HCl etchant gas at very low partial pressure in a hydrogen, nitrogen, or argon ambient. High partial pressures of Cl and HCl are known to roughen the silicon surface during etching steps, but very low partial pressures of the etchant gas may preferentially etch surface high points while the silicon released from the etching process could migrate and preferentially bond at surface low points. Adding a silicon species at very low partial pressure in a hydrogen or argon ambient is also possible (very low growth silicon preferentially planarizes a <100> surface, completing growth of one monolayer before starting the next monolayer). Silane, disilane, and dichlorosilane are silicon gas species useful for this type of technique. Alternatively, an epitaxy silicon growth step under selective silicon deposition conditions may be utilized (where silicon and an etchant gas like Cl or HCl are both delivered to the wafer in a hydrogen or argon ambient), even though a blanket silicon (no exposed dielectric on the wafer surface) deposition is being performed. Much like the previous recommended condition, selective silicon favors layer-by-layer growth, which can smooth the surface during the layer growth.

The method and system herein provides for a flexible implementation. Although described using certain specific examples, it will be apparent to those skilled in the art that the examples are illustrative and that many variations exist. The present method is applicable to a variety of technologies, including planar CMOS, SOL finFETs etc., and it is readily applicable to a variety of devices including, but not limited to, logic devices, memory devices, etc. While particularly useful for blanket epitaxial silicon depositions, including very thin intrinsic silicon deposited over lightly doped substrates, various of the techniques described could be used for heavily doped silicon, silicon alloys, metal layers, and selective silicon deposition. Wafers comprised of any of a variety of semiconducting materials, e.g., silicon, gallium arsenide, etc. can be used. Moreover, such wafers, if appropriate, may be doped with a variety of dopant materials, e.g., arsenic, phosphorous, boron, etc. Lastly, as used herein, the term wafer should be understood to include the bare wafer itself, i.e. bare silicon, or a wafer having an epitaxial silicon layer (epi layer) formed above the bare silicon. As will be understood, wafers and die supporting multiple transistor types, including those with and without the described dopant layers and structures, are contemplated. Electronic devices that include the disclosed transistor structures or are manufactured in accordance with the disclosed processes can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via a motherboard, electrical or optical interconnect, stacking, or through used of 3D wafer bonding or packaging.

Although the present disclosure has been described in detail with reference to a particular embodiment, it should be understood that various other changes, substitutions, and alterations may be made hereto without departing from the spirit and scope of the appended claims. Although the present disclosure includes a description with reference to a specific ordering of processes, other process sequencing may be followed and other incidental process steps may be performed to achieve the end result discussed herein. Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification.

What is claimed is:

1. A method for fabricating a semiconductor structure on a semiconductor substrate, comprising:

masking portions of the substrate to form a pattern of transistors;

performing a pre-amorphization implant into selected open areas defining a channel stack underlying a gate for a plurality of transistor elements of a similar type;

performing a carbon ion implantation into the selected open areas in addition to the pre-amorphization implant;

performing a boron ion implantation into the selected open areas in addition to the carbon ion implantation so as to form a screening region for the transistor element;

performing a solid phase epitaxy after the carbon and boron ion implantations to cause the amorphized portions to transform into crystalline structures;

performing an activation anneal to activate the boron by rendering the boron substitutional;

forming a threshold voltage control layer on the boron screening region of the transistor element; and forming an epitaxial channel layer on the threshold control layer of the transistor element.

2. The method of claim 1, wherein the threshold voltage control layer is comprised of ion implanted boron.

3. The method of claim 1, wherein the threshold voltage control layer is comprised of a fully substitutional in-situ doped epitaxial layer.

4. The method of claim 1, wherein the activation anneal is a spike anneal performed at a temperature of 800° C. to 1500° C.

5. The method of claim 4, wherein the spike anneal is performed after the solid phase epitaxy but prior to other thermal processes performed on the semiconductor substrate.

6. The method of claim 1, wherein the pre-amorphization implant uses germanium.

* * * * *